US010285297B2

(12) United States Patent
Bratcher et al.

(10) Patent No.: US 10,285,297 B2
(45) Date of Patent: May 7, 2019

(54) RECESSED POWER SYSTEM

(71) Applicant: Bretford Manufacturing, Inc., Franklin Park, IL (US)

(72) Inventors: Virgil Bratcher, Lake in the Hills, IL (US); Christopher Petrick, Park Ridge, IL (US); Matt Banach, Gurnee, IL (US); Andrew Goodfellow, Phoenix, AZ (US); Jeff Mowry, Westcliffe, CO (US); Yani Deros, Phoenix, AZ (US)

(73) Assignee: Bretford Manufacturing, Inc., Franklin Park, IL (US)

( * ) Notice: Subject to any disclaimer, the term of this patent is extended or adjusted under 35 U.S.C. 154(b) by 52 days.

(21) Appl. No.: 15/183,841

(22) Filed: Jun. 16, 2016

(65) Prior Publication Data

US 2016/0302321 A1    Oct. 13, 2016

Related U.S. Application Data

(63) Continuation of application No. PCT/US2015/028167, filed on Apr. 29, 2015.
(Continued)

(51) Int. Cl.
*H05K 7/02* (2006.01)
*H01R 24/84* (2011.01)
(Continued)

(52) U.S. Cl.
CPC ......... *H05K 7/026* (2013.01); *H01R 13/4536* (2013.01); *H01R 13/6205* (2013.01);
(Continued)

(58) Field of Classification Search
CPC .. H01R 13/6205; H01R 35/04; H01R 25/006; H01R 24/58; H01R 31/06; H01R 27/00;
(Continued)

(56) References Cited

U.S. PATENT DOCUMENTS 2,170,287 A * 8/1939 Kinnebrew ........ H01R 13/6205
                                                     439/180
2,750,572 A *  6/1956 Fox ........................ H01R 13/28
                                                     220/8
(Continued)

FOREIGN PATENT DOCUMENTS

EP       0 702 433 B1    3/1996
EP       1 182 747 A2    2/2002
(Continued)

OTHER PUBLICATIONS

Amazon.com, Seismic Audio SA-PLATE25 Black Stainless steel Wall Plate with 2 Gang XLR Male and Female Connectors, May 16, 2014 (Year: 2014).*
(Continued)

*Primary Examiner* — James Wu
*Assistant Examiner* — Michael A Matey
(74) *Attorney, Agent, or Firm* — Anderson Gorecki LLP

(57) ABSTRACT

A power system includes a chassis, a plurality of conductors disposed within the chassis, and apertures formed within the chassis to provide consistent access to power provided by the conductors by a modular power component when the modular power component is oriented in at least two orientations relative to the chassis. The modular power components are removable from the power system and may be implemented to provide AC or DC power at a surface. The modular power components rotate relative to the chassis to extend above the surface when in use or to be flush with the surface when not in use.

24 Claims, 38 Drawing Sheets

Related U.S. Application Data

(60) Provisional application No. 61/985,766, filed on Apr. 29, 2014.

(51) Int. Cl.
  *H01R 24/76* (2011.01)
  *H01R 13/62* (2006.01)
  *H01R 13/453* (2006.01)
  *H01R 103/00* (2006.01)

(52) U.S. Cl.
  CPC ............. *H01R 24/76* (2013.01); *H01R 24/84* (2013.01); *H01R 2103/00* (2013.01)

(58) Field of Classification Search
  CPC ................ H01R 11/30; H01R 13/7037; H01R 2105/00; H01R 25/003; B64D 11/0624
  See application file for complete search history.

(56) References Cited

U.S. PATENT DOCUMENTS

| | | | |
|---|---|---|---|
| 2,942,224 | A | 6/1960 | Messing |
| 3,577,105 | A * | 5/1971 | Jones, Jr. ................ H01P 1/042 |
| | | | 333/239 |
| 3,739,317 | A | 6/1973 | Wise |
| 3,786,391 | A * | 1/1974 | Mathauser ......... H01R 13/6205 |
| | | | 335/205 |
| 4,511,198 | A | 4/1985 | Mitchell et al. |
| 4,551,577 | A | 11/1985 | Byrne |
| 4,583,798 | A | 4/1986 | Blazowich |
| 4,637,666 | A | 1/1987 | Worrell et al. |
| 4,647,120 | A * | 3/1987 | Karabakakis ...... H01R 13/7037 |
| | | | 200/51.09 |
| 4,748,913 | A | 6/1988 | Favaretto et al. |
| 4,792,881 | A | 12/1988 | Wilson et al. |
| 4,874,316 | A * | 10/1989 | Kamon .............. H01R 13/2421 |
| | | | 439/374 |
| 5,035,635 | A | 7/1991 | Tsai et al. |
| 5,122,069 | A | 6/1992 | Brownlie et al. |
| 5,176,530 | A * | 1/1993 | Reylek .................... H01R 4/26 |
| | | | 439/290 |
| 5,230,552 | A | 7/1993 | Schipper et al. |
| 5,231,562 | A | 7/1993 | Pierce et al. |
| 5,237,935 | A | 8/1993 | Newhouse et al. |
| 5,352,122 | A | 10/1994 | Speyer et al. |
| D353,363 | S | 12/1994 | Toby |
| D356,996 | S | 4/1995 | Henderson et al. |
| 5,575,668 | A | 11/1996 | Timmerman |
| 5,709,156 | A | 1/1998 | Gevaert et al. |
| D392,254 | S | 3/1998 | Gevaert |
| 5,755,582 | A | 5/1998 | Charlton |
| 5,860,713 | A | 1/1999 | Richardson |
| D405,051 | S | 2/1999 | Byrne |
| D405,052 | S | 2/1999 | Byrne |
| D406,102 | S | 2/1999 | Byrne |
| D406,103 | S | 2/1999 | Byrne |
| D407,373 | S | 3/1999 | Byrne |
| D407,374 | S | 3/1999 | Byrne |
| 5,885,109 | A * | 3/1999 | Lee ...................... H01R 13/514 |
| | | | 439/131 |
| D412,695 | S | 8/1999 | Byrne |
| D412,696 | S | 8/1999 | Byrne |
| D412,697 | S | 8/1999 | Byrne |
| D412,698 | S | 8/1999 | Byrne |
| D413,571 | S | 9/1999 | Glass |
| 5,954,525 | A | 9/1999 | Siegal et al. |
| 5,967,815 | A | 10/1999 | Schlessinger et al. |
| 5,967,820 | A | 10/1999 | Siegal et al. |
| 6,004,157 | A | 12/1999 | Glass |
| 6,015,307 | A | 1/2000 | Chiu et al. |
| D420,327 | S | 2/2000 | Byrne |
| 6,030,229 | A * | 2/2000 | Tsutsui ............... H01R 13/6205 |
| | | | 336/90 |
| 6,046,405 | A | 4/2000 | Obermann |
| 6,068,490 | A | 5/2000 | Salzberg |
| 6,085,667 | A | 7/2000 | Gevaert et al. |
| 6,123,562 | A | 9/2000 | King et al. |
| 6,190,180 | B1 | 2/2001 | Purington et al. |
| 6,196,851 | B1 | 3/2001 | Gerard et al. |
| 6,234,812 | B1 | 5/2001 | Ivers et al. |
| 6,302,743 | B1 * | 10/2001 | Chiu .................... H01R 25/003 |
| | | | 439/22 |
| 6,327,983 | B1 | 12/2001 | Cronk et al. |
| 6,329,597 | B1 | 12/2001 | Kaloustian |
| 6,332,794 | B1 | 12/2001 | Tzeng Jeng |
| 6,338,301 | B1 | 1/2002 | Almond |
| 6,397,762 | B1 | 6/2002 | Goldberg et al. |
| 6,435,106 | B2 | 8/2002 | Funk et al. |
| D466,868 | S | 12/2002 | Gershfeld |
| D467,230 | S | 12/2002 | Byrne |
| 6,492,591 | B1 | 12/2002 | Metcalf |
| D468,701 | S | 1/2003 | Byrne |
| D472,213 | S | 3/2003 | Byrne |
| 6,526,895 | B1 | 3/2003 | Kochanski et al. |
| 6,540,554 | B2 | 4/2003 | McCarthy |
| 6,544,069 | B1 | 4/2003 | Enriquez, Sr. et al. |
| 6,568,942 | B2 | 5/2003 | Lau et al. |
| 6,607,391 | B2 | 8/2003 | Mendelson et al. |
| 6,638,074 | B1 * | 10/2003 | Fisher .................... H01R 35/04 |
| | | | 439/18 |
| D486,793 | S | 2/2004 | Gershfeld |
| 6,750,410 | B2 | 6/2004 | Lee |
| 6,756,543 | B1 | 6/2004 | Kaloustian |
| 6,802,577 | B2 | 10/2004 | Gershfeld |
| 6,966,781 | B1 * | 11/2005 | Bullinger ........... H01R 13/6205 |
| | | | 439/289 |
| 6,979,209 | B2 | 12/2005 | Griepentrog |
| D516,028 | S | 2/2006 | Deng |
| D516,513 | S | 3/2006 | Kissinger et al. |
| 7,083,421 | B1 | 8/2006 | Mori |
| 7,121,834 | B2 | 10/2006 | Gerard |
| 7,125,256 | B2 | 10/2006 | Gerard |
| D535,257 | S | 1/2007 | Byrne |
| D537,785 | S | 3/2007 | Pincek |
| 7,192,303 | B2 * | 3/2007 | Kohen .................... F21V 21/03 |
| | | | 439/135 |
| 7,214,102 | B2 | 5/2007 | Chong |
| 7,217,142 | B1 | 5/2007 | Wu |
| 7,238,028 | B2 | 7/2007 | Gerard |
| 7,244,128 | B2 | 7/2007 | Byrne |
| 7,247,046 | B1 | 7/2007 | Wu |
| D556,139 | S | 11/2007 | Gershfeld |
| 7,306,471 | B2 | 12/2007 | Shau-din |
| 7,311,526 | B2 | 12/2007 | Rohrbach et al. |
| 7,341,458 | B1 | 3/2008 | Koh |
| 7,399,205 | B2 | 7/2008 | McNeely et al. |
| 7,407,392 | B2 | 8/2008 | Cooke et al. |
| 7,435,091 | B2 | 10/2008 | Cruz |
| 7,445,452 | B1 | 11/2008 | Wu |
| 7,462,074 | B1 | 12/2008 | Devlin et al. |
| 7,497,740 | B2 | 3/2009 | Mei et al. |
| 7,500,854 | B2 | 3/2009 | Gottstein |
| 7,544,076 | B2 | 6/2009 | Lubkert |
| 7,566,224 | B2 | 7/2009 | Wu |
| 7,575,436 | B1 | 8/2009 | Devlin et al. |
| 7,625,212 | B2 | 12/2009 | Du |
| 7,632,134 | B2 | 12/2009 | Su et al. |
| 7,658,613 | B1 | 2/2010 | Griffin et al. |
| 7,736,178 | B2 | 6/2010 | Byrne |
| 7,753,682 | B2 | 7/2010 | Gerard |
| 7,775,801 | B2 * | 8/2010 | Shiff .................... H01R 13/6205 |
| | | | 439/39 |
| 7,834,729 | B2 * | 11/2010 | Fullerton ................. G01D 1/00 |
| | | | 24/303 |
| D629,069 | S | 12/2010 | Parsons et al. |
| D629,752 | S | 12/2010 | Akana et al. |
| 7,874,844 | B1 | 1/2011 | Fitts, Jr. |
| D636,728 | S | 4/2011 | Terleski et al. |
| 7,938,679 | B2 | 5/2011 | Wadsworth et al. |
| D639,244 | S | 6/2011 | Byrne |
| 7,966,951 | B1 | 6/2011 | Black et al. |
| 7,967,609 | B2 | 6/2011 | Capece et al. |

(56) References Cited

U.S. PATENT DOCUMENTS

| | | | |
|---|---|---|---|
| 7,974,058 B2 * | 7/2011 | Maigret | H01H 89/06 |
| | | | 200/51.02 |
| 8,007,283 B2 | 8/2011 | Gerard | |
| 8,007,295 B2 | 8/2011 | Lin | |
| 8,022,664 B2 | 9/2011 | Shu | |
| 8,025,506 B2 | 9/2011 | Cairns | |
| 8,051,782 B2 | 11/2011 | Nethken et al. | |
| 8,123,528 B2 | 2/2012 | Devlin et al. | |
| 8,146,229 B2 | 4/2012 | Henriott et al. | |
| 8,172,604 B2 | 5/2012 | Byrne | |
| 8,210,853 B2 | 7/2012 | Gerard | |
| 8,271,038 B2 | 9/2012 | Fadell et al. | |
| 8,276,523 B2 | 10/2012 | Miller et al. | |
| 8,277,226 B2 | 10/2012 | Almouli | |
| 8,287,292 B2 | 10/2012 | Byrne | |
| 8,342,857 B2 | 1/2013 | Palli et al. | |
| 8,388,353 B2 | 3/2013 | Kiani et al. | |
| 8,401,219 B2 | 3/2013 | Hankey et al. | |
| 8,430,679 B1 | 4/2013 | Long et al. | |
| D682,213 S | 5/2013 | Byrne et al. | |
| 8,444,432 B2 | 5/2013 | Byrne | |
| D685,329 S | 6/2013 | Byrne et al. | |
| 8,475,175 B2 | 7/2013 | Gerard | |
| 8,475,186 B1 | 7/2013 | Sikkema et al. | |
| 8,480,415 B2 | 7/2013 | Byrne | |
| 8,480,429 B2 | 7/2013 | Byrne | |
| 8,482,252 B2 | 7/2013 | Byrne | |
| 8,497,753 B2 | 7/2013 | DiFonzo et al. | |
| 8,500,492 B2 | 8/2013 | Brown et al. | |
| 8,512,065 B2 | 8/2013 | Byrne et al. | |
| 8,512,072 B1 | 8/2013 | Black et al. | |
| 8,651,876 B2 * | 2/2014 | Mysliwiec | H01R 13/6205 |
| | | | 439/39 |
| D701,836 S | 4/2014 | Byrne | |
| 8,764,463 B2 | 7/2014 | Byrne et al. | |
| 9,077,105 B2 * | 7/2015 | Kim | H01R 13/6205 |
| 9,083,110 B2 * | 7/2015 | McClelland | H01R 13/6205 |
| 9,270,069 B2 * | 2/2016 | Hammond | H01R 13/28 |
| 9,647,385 B2 * | 5/2017 | Suh | H01R 13/6205 |
| 9,685,742 B2 * | 6/2017 | Liu | H01R 13/713 |
| 2005/0268823 A1 | 12/2005 | Bakker et al. | |
| 2006/0281349 A1 * | 12/2006 | Chong | H01R 35/04 |
| | | | 439/131 |
| 2007/0072442 A1 * | 3/2007 | DiFonzo | H01R 13/6205 |
| | | | 439/39 |
| 2007/0161262 A1 | 7/2007 | Lloyd | |
| 2007/0170826 A1 | 7/2007 | Tsao | |
| 2007/0184703 A1 * | 8/2007 | Kim | H01R 13/70 |
| | | | 439/346 |
| 2008/0020649 A1 * | 1/2008 | Scherer | H01R 13/28 |
| | | | 439/639 |
| 2008/0061662 A1 | 3/2008 | Lin | |
| 2008/0165982 A1 | 7/2008 | Hankey et al. | |
| 2008/0197702 A1 | 8/2008 | Banach | |
| 2010/0227498 A1 | 9/2010 | Byrne | |
| 2011/0223783 A1 * | 9/2011 | Pearson | H01R 13/652 |
| | | | 439/101 |
| 2012/0028505 A1 | 2/2012 | Weber et al. | |
| 2012/0097418 A1 * | 4/2012 | Ruotsala | H02G 11/00 |
| | | | 174/60 |
| 2012/0177324 A1 | 7/2012 | Schwandt et al. | |
| 2012/0231657 A1 | 9/2012 | Bouse et al. | |
| 2012/0262006 A1 * | 10/2012 | Elberbaum | H02G 3/12 |
| | | | 307/112 |
| 2013/0061783 A1 * | 3/2013 | Bennie | A47B 21/06 |
| | | | 108/25 |
| 2013/0065406 A1 | 3/2013 | Rohrbach et al. | |
| 2013/0070403 A1 * | 3/2013 | Lo | G06F 1/1632 |
| | | | 361/679.02 |
| 2013/0102164 A1 * | 4/2013 | Sip | H01R 13/642 |
| | | | 439/38 |
| 2013/0170794 A1 | 7/2013 | DiFonzo et al. | |
| 2014/0104805 A1 * | 4/2014 | Row | H01R 13/516 |
| | | | 361/807 |
| 2014/0302691 A1 * | 10/2014 | Janfada | H01R 13/629 |
| | | | 439/39 |
| 2016/0061783 A1 | 3/2016 | Viren | |
| 2016/0204557 A1 * | 7/2016 | Kim | H01R 24/40 |
| | | | 439/578 |
| 2017/0325664 A1 * | 11/2017 | Kirma | A61B 1/00096 |
| 2018/0040975 A1 * | 2/2018 | Davies | H01R 13/629 |

FOREIGN PATENT DOCUMENTS

| | | |
|---|---|---|
| EP | 0 881 729 B1 | 7/2012 |
| GB | 2 351 187 B | 12/2000 |
| KR | 10-2009-0124901 | 12/2009 |
| KR | 20-0448330 | 4/2010 |
| WO | WO2008/108739 | 9/2008 |
| WO | WO2011/013941 | 2/2011 |

OTHER PUBLICATIONS

Han 70A Hybrid Model Datasheet, Harding Electric Gmbh & Co. Kg, May 9, 2011.
International Search Report from parent PCT application PCT/US2015/028167 dated Jan. 2015 (4 pages).
Written Opinion from parent PCT application PCT/US2015/028167 dated Aug. 12, 2015 (9 pages).
International Preliminary Report on Patentability from parent PCT application PCT/US2015/028167 dated Nov. 10, 2016 (11 pages).

* cited by examiner

RECESSED POWER SYSTEM

CROSS-REFERENCE TO RELATED APPLICATIONS

This application claims priority to U.S. Provisional Application No. 61/985,766, filed Apr. 29, 2014, entitled Power System, the content of which is hereby incorporated herein by reference.

BACKGROUND

This disclosure relates to a recessed power system designed to provide power at a surface.

SUMMARY

All examples and features mentioned below can be combined in any technically possible way.

In one aspect, a connector for a power system, includes a face, the face having a concave surface and a mirror image convex surface. A plurality of magnets are disposed about the face. At least one male electrical connector extends from the face and at least one female electrical connector slot is defined in the face.

In some implementations, the female electrical connector slot is configured to receive a male electrical connector of a matching second connector.

In certain implementations, the at least one electrical connector extends from the concave surface and the at least one female electrical connector slot is defined in the convex surface.

In some implementations, the connector includes three male electrical connectors extending from the face and three female electrical connector slots defined in the face.

In certain implementations, the three male connectors extend from the concave surface of the face and the three female electrical connector slots are defined in the mirror image convex surface.

In some implementations, the connector further includes at least one power input connector, and the at least one male electrical connector, extending from the face, is not electrically interconnected to the at least one power input connector until the female electrical connector slot receives a matching male electrical connector from a similarly configured second connector.

In certain implementations, the connector further includes at least one asymmetric feature defining the connector as either a male or female connector.

In some implementations, the at least one asymmetric feature is a tab extending beyond the face on a first location of the face and an indentation extending into the face at a second location of the face.

In certain implementations, the first location and the second location are symmetrically located about a center line of the face.

In some implementations, the first location and second location are reversed in a male version of the connector when compared to a female version of the connector.

In another aspect a power system includes at least one modular power component, a body configured to receive the at least one modular power component, and a slide disposed within the body and movable within the body, the slide having a plurality of extensions to selectively engage the modular power component within the body in a first position and a corresponding plurality of openings to selectively not engage the modular power component within the body in a second position. In this aspect, the slide is movable between the first position and the second position to selectively enable the modular power component to be retained within the body when the slide is in the first position and to selectively enable the modular power component to be removed from the body when the slide is in the second position.

In some implementations the slide is movable from the first position to the second position from outside the body via an aperture in the body.

In another aspect a power system includes a body, a chassis disposed within the body, the chassis having a plurality of slots in each of a plurality of modular power component receiving areas, a plurality of modular power components supported by the chassis in the modular power component receiving areas, the modular power components having power connectors extending through the slots, and a power distribution system disposed below the chassis and in electrical communication with the power connectors of each of the plurality of modular power components. In this aspect, a first subset of the slots in a first of the receiving areas are arranged to correspond with the power connectors of a first of the modular power components when the first of the modular power components is oriented in a first direction, and wherein a second subset of the slots in the first of the receiving areas are arranged to correspond with the power connectors of the first of the modular power components when the first of the modular power components is oriented in a second direction.

In some implementations the first direction is 180 degrees rotated from the second direction.

In certain implementations, at least one slot of the first subset of slots is also included in the second subset of slots.

In some implementations at least two slots of the first subset of slots are not included in the second subset of slots.

In certain implementations, the power distribution system includes a plurality of conductors disposed below the slots.

In some implementations the plurality of conductors includes a first pair of hot conductors, a second pair of neutral conductors, and at least one ground conductor.

In certain implementations, the at least five conductors are formed as bus bars, wherein the ground conductor is a middle bus bar and the first and second pair of hot and neutral conductors being arranged symmetrically relative to the middle bus bar.

In some implementations the chassis is configured to shed water away from the plurality of conductors.

In certain implementations, the chassis is configured to prevent a person from touching the conductors when the modular power component is removed from the power system.

In another aspect, a power system includes a body configured to house one or more modular power components, the body having a top surface with a circumferential lip to support the top surface of the body along at least a portion of a circumference of an aperture in an article when the body is inserted into the aperture, a retaining bracket configured to encircle the body and engage a lower surface of the article around the aperture, a plurality of first friction elements on the bracket configured to engage a corresponding plurality of second friction elements on the body to hold the bracket relative to the body, and spring tab formed on an upper surface of the bracket to engage the lower surface of the article.

In some implementations the first friction elements on the bracket are formed in four locations about an interior surface of the bracket, and wherein the second friction elements on the body are formed in four corresponding locations on the body.

In certain implementations, the body has a plurality of tabs, and wherein the second friction elements on the body are formed on the tabs.

In some implementations the first and second friction elements are serrated teeth.

In certain implementations, the first and second friction elements are bumps and detents.

DETAILED DESCRIPTION

This disclosure is based, at least in part, on the realization that it is desirable to provide a recessed power system that is easy to install into a surface, is able to be positioned to be flush with the surface when not in use, and that is easily reconfigurable using modular elements and power components.

Overview

Figure 3:
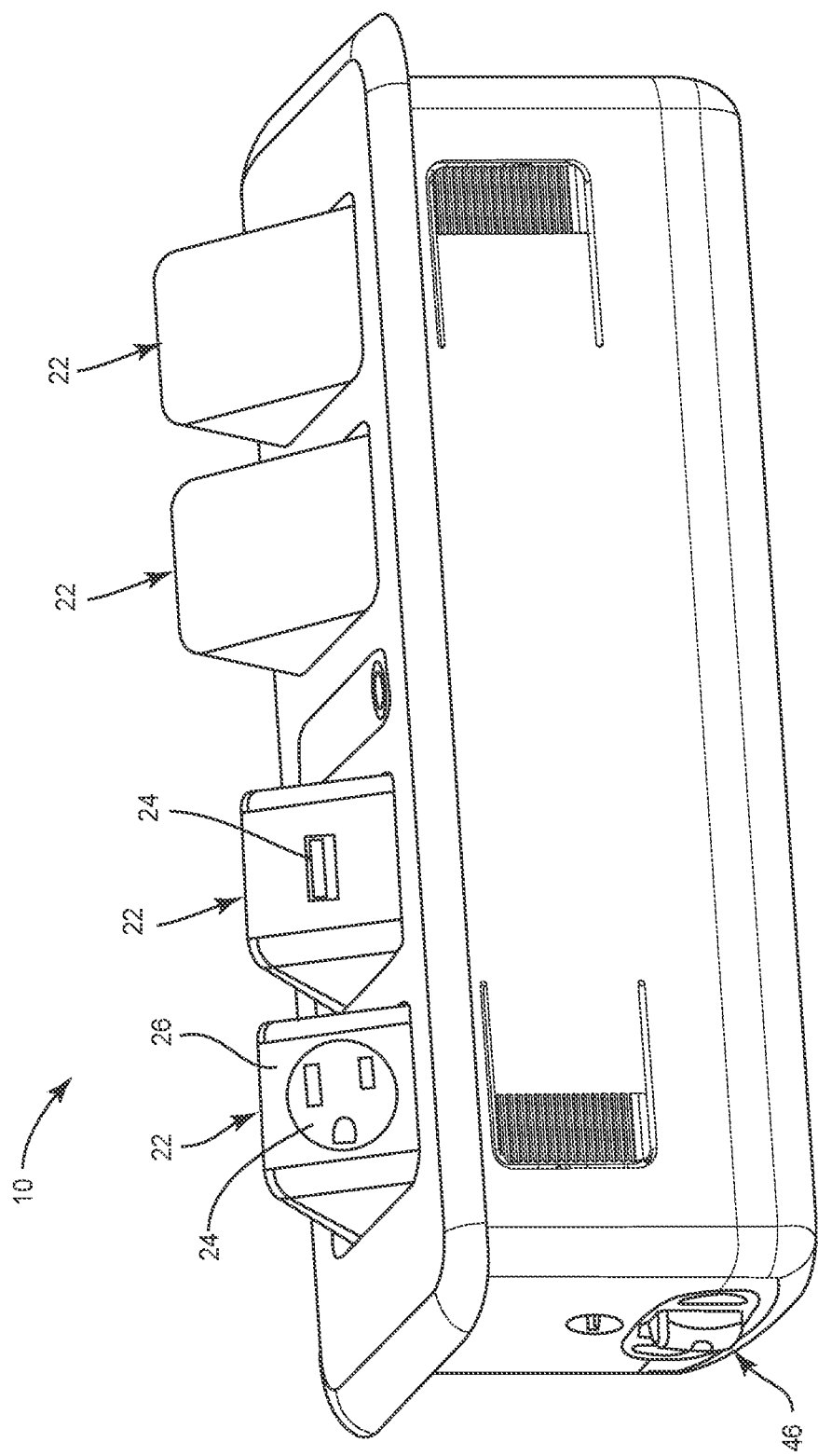

FIGS. 1-5 are perspective views of an example power system 10. The power system 10 includes a housing 12 with a top surface 14 and a body 16. Modular power components 18 are designed to be received within body 16 and have top surfaces which are flush with top surface 14 when the modular power components 18 are in a retracted position as shown in FIGS. 1, 2, 4 and 5. Modular power components 18 are designed to rotate up into an extended position as shown in FIG. 3. In an implementation, the modular power components 18 are moved from the retracted position to the extended position by pushing on portion 20 of an exposed top surface (see FIG. 1) to cause the modular power component to rotate, so that the opposite end 22 of the modular power component extends up above the top surface 14 of the body 16. This provides access to an electrical outlet 24 formed within a face 25 of the modular power component.

To return the modular power component 18 to the retracted position (move from the extended position to the retracted position), the user will push on the top surface 14 of the modular power component 18 close to the opposite end 22, to cause the modular power component to rotate back into the housing 12 of power system 10. This causes the top surface of the modular power component to become flush with the rest of the top surface of power system 10.

Figure 6:
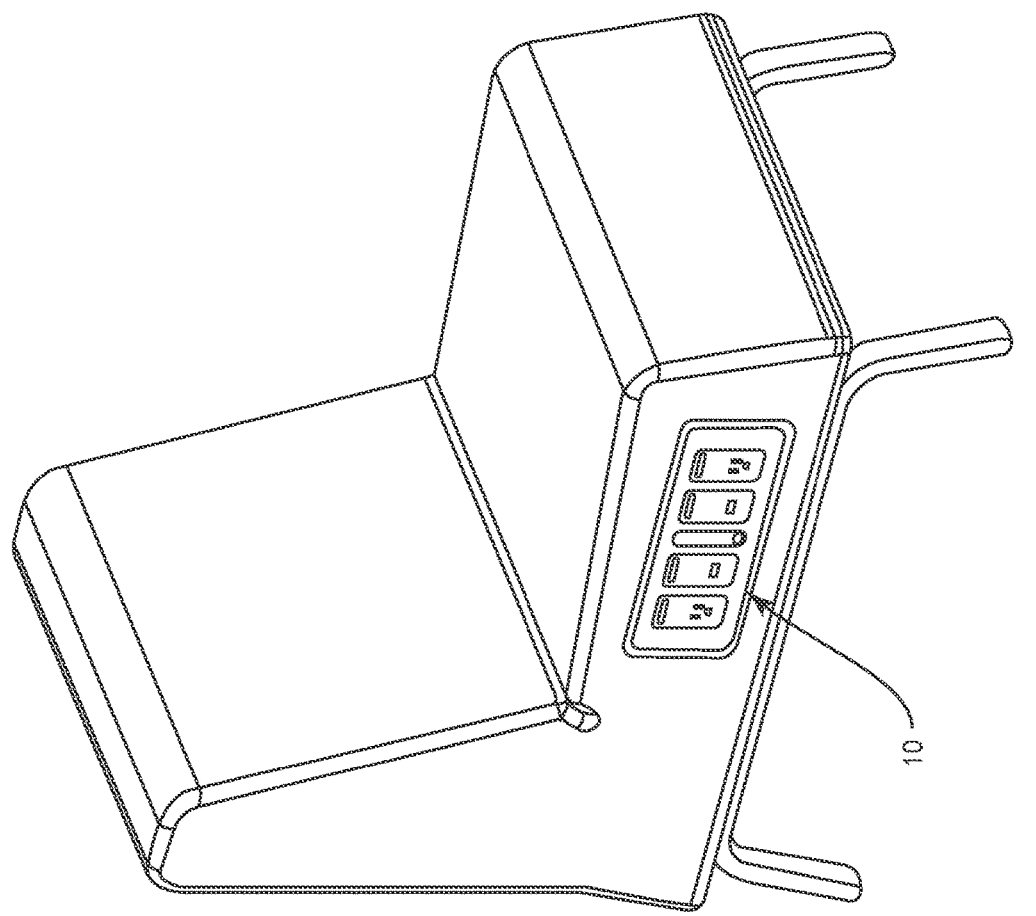
FIG. 6 is a perspective view of an object including a power system on a vertical surface.

A supporting undersurface 28 extends around a periphery of the power system and is configured to engage a mounting surface of an object to enable the body to sit within an aperture created in the mounting surface. For example, an aperture may be created in a top surface of a desk, table, or other flat surface where it is desirable to provide power. The body 16 of the power system 10 may be inserted into the aperture such that the supporting undersurface 28 sits flush with the top surface of the desk. Other surfaces which may be provided with power include horizontal surfaces such as dining surfaces, for example for use in cafeterias or cafes, and vertical surfaces such as on furniture, e.g. as shown in FIG. 6.

As discussed in greater detail below, modular power components 18 are designed to be individually inserted into the body 16 of the power system in two orientations. For example, as shown in FIGS. 1, 2, 4 and 5, the modular power components may be oriented to all face in one direction. Alternatively, as shown in FIG. 3, the modular power components may be oriented to face in different directions. The orientation of each modular power component is independent of the orientation of any other modular power component. Likewise the orientation of a given modular power component may be changed by removing the modular power component from the body 16 and reinserting the modular power component in the opposite orientation. Additional details of how the modular power components are implemented and interconnect with a power distribution system is provided below.

Retaining Bracket

Figure 1:
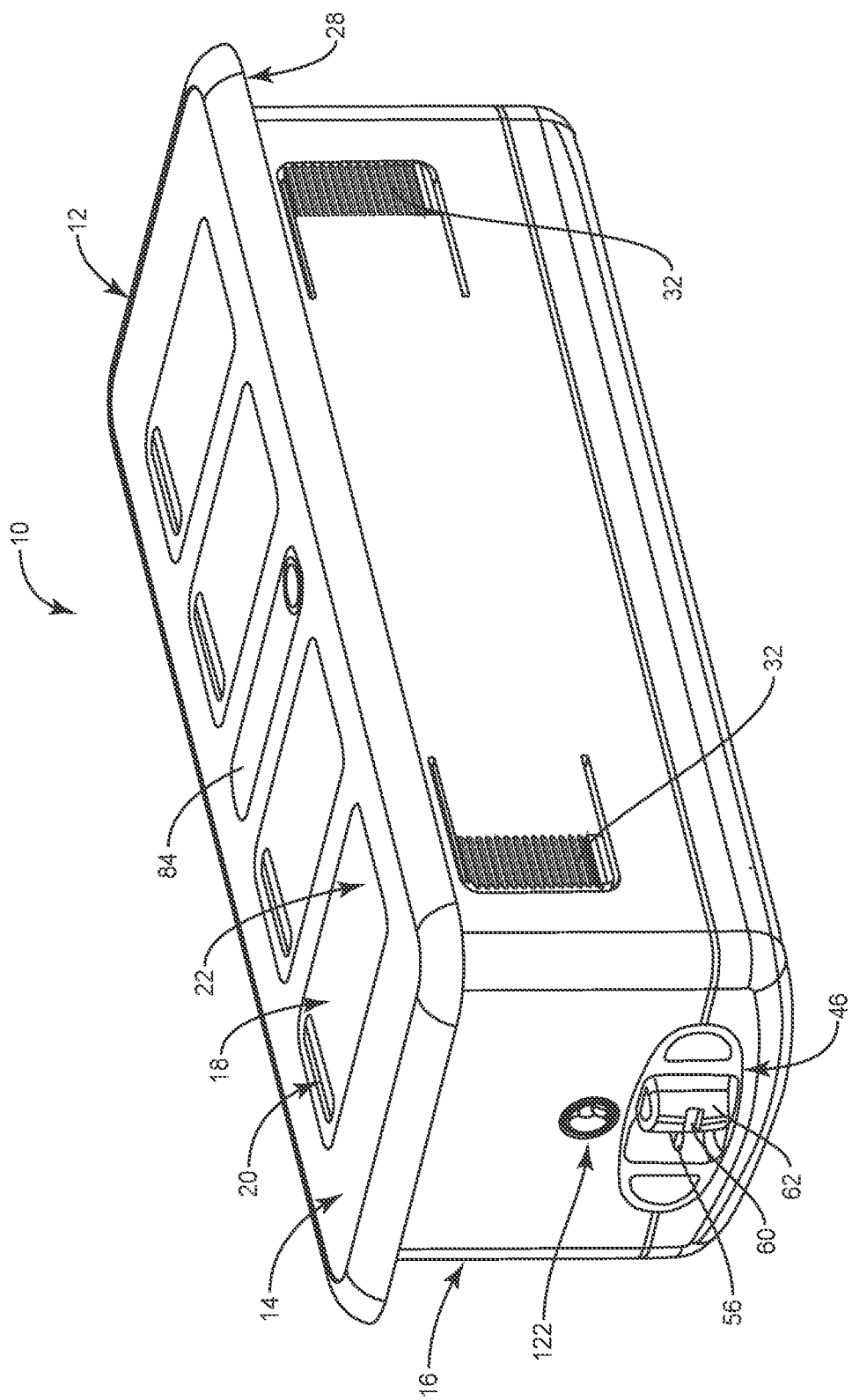
FIGS. 1-5 are perspective views of an example power system for providing power at a surface.
Figure 2:
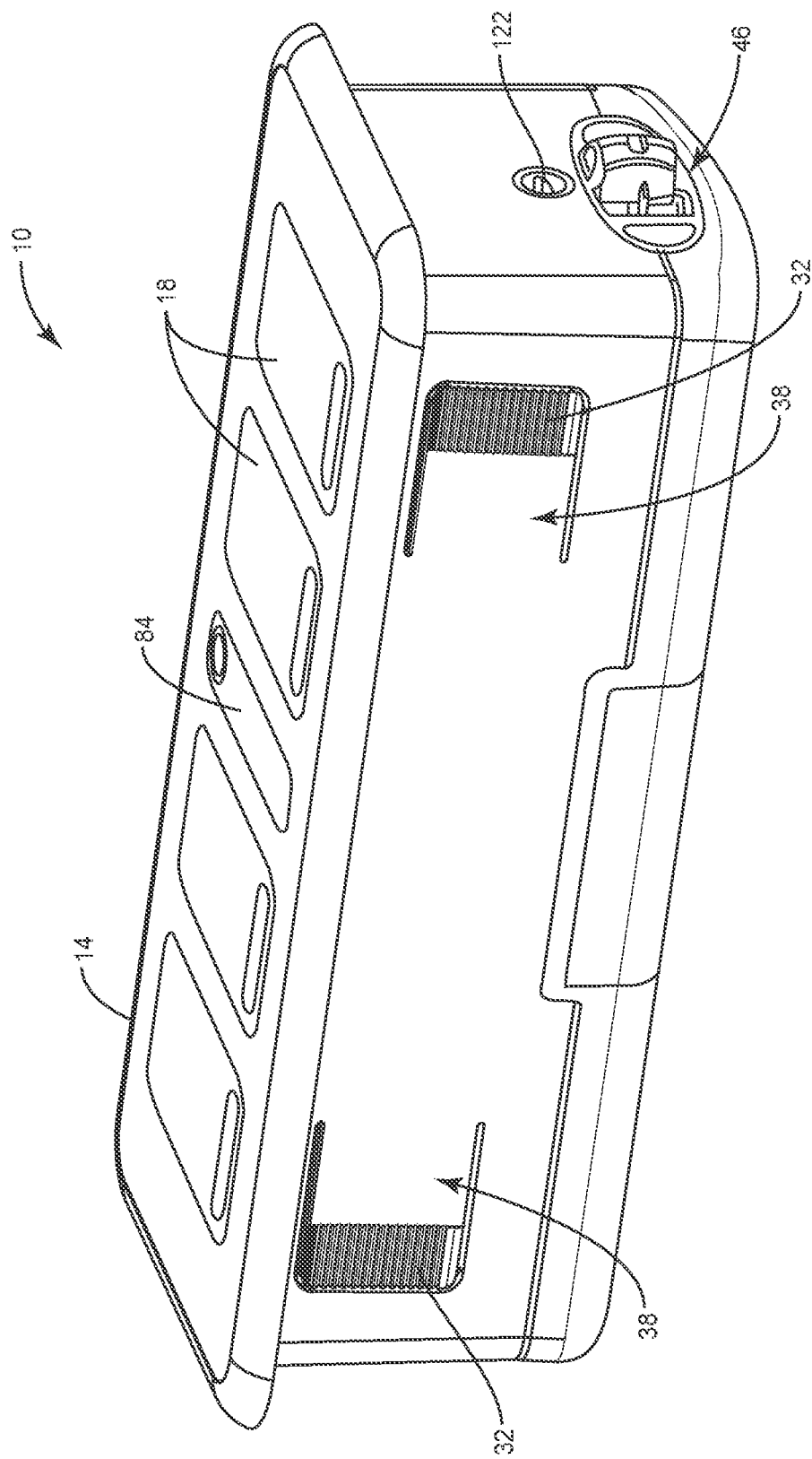
Figure 4:
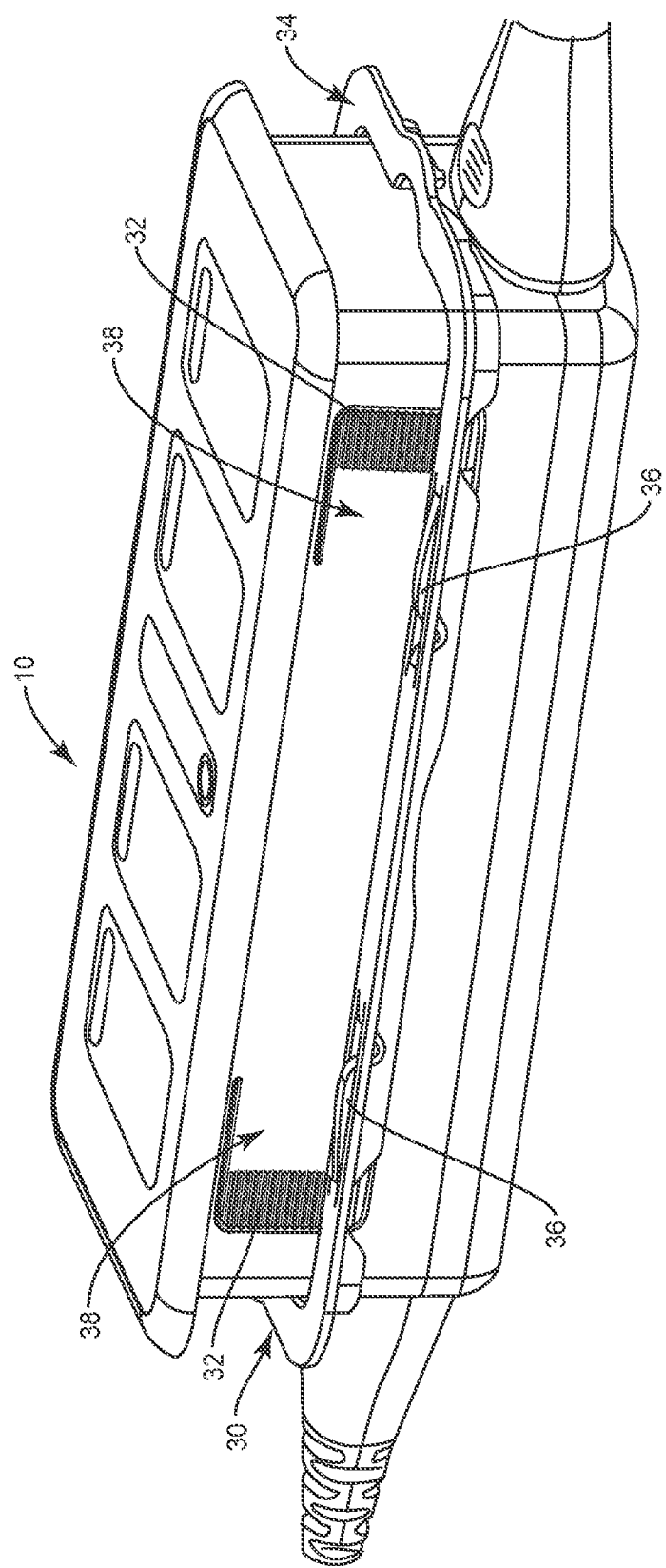
Figure 5:
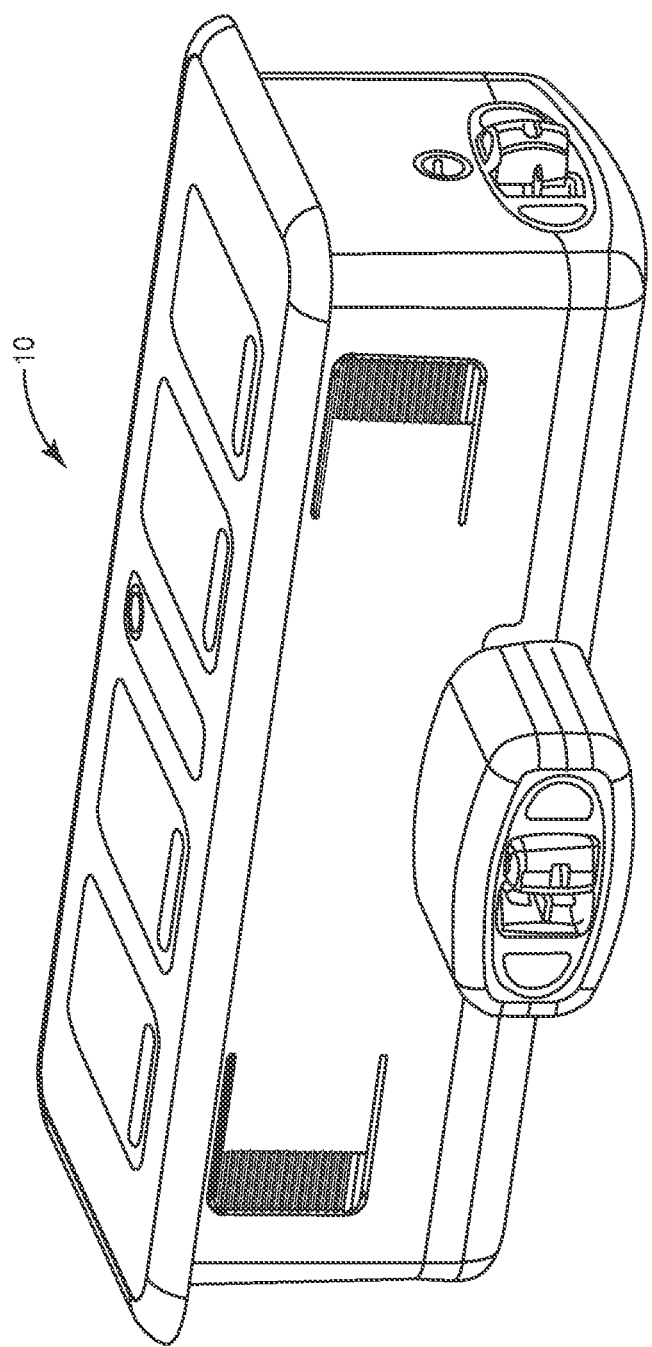

FIG. 4 shows an implementation in which a retaining bracket 30 is provided to secure the power system to a flat surface when the power system is inserted into an aperture in the flat surface. As shown in FIG. 1, in an implementation the body of the power system is inserted into an aperture in a flat surface such that the supporting undersurface 28 is in contact with the top surface in the region adjacent the aperture. The supporting undersurface thus prevents the power system from being pulled through the aperture. Retaining bracket 30 is then slid up around the body 16 of the power system 10 to secure the power system within the aperture by engaging a lower surface of the flat surface in the region adjacent the aperture.

In one implementation, the body 16 includes friction elements 32 formed at one or more locations around its perimeter. In the example shown in FIGS. 1-5, the friction elements are formed as serrated teeth, bumps, or detents, and are located at four locations adjacent four corners of the power system body, although additional or fewer locations may be used in other implementations. The friction elements 30 are formed, in this implementation, to extend farther than an expected thickness of the flat surface to enable the retaining bracket 30 to engage the friction elements 32 when it is slide up around the body 16. Engagement of the retaining bracket 30 with the friction elements 32 causes the retaining bracket to be held in place below the flat surface to secure the power system within the aperture in the flat surface.

The retaining bracket 30 has corresponding friction elements (not shown) which engage the friction elements 32 on the body 16 of the power system. For example, where the friction elements 32 on the body are formed as a set of serrated teeth, the friction elements on the retaining bracket would likewise be formed as sets of serrated teeth to mesh with and engage the friction elements 32 on the body. Where the friction elements 32 on the body are formed as a set of detents, the friction elements on the retaining bracket would be formed as a set of bumps to fit within and engage the detents forming friction elements 32 on the body.

In operation, the power system 10 is inserted into an aperture in a flat surface such as a table top, and the retaining bracket is slid up around the body 16 from the bottom to encircle the body of the power system. As the retaining bracket 30 is slid upward, the friction elements on the retaining bracket engage the friction elements 32 on the body 16 to prevent the bracket from slipping back off of power system 10. The retaining bracket 30 is thus pushed onto the body 16 until an upper surface 34 of the retaining bracket is adjacent a lower surface of the flat surface. The friction elements 32 on the body and the friction elements on the retaining bracket cooperate to hold the bracket adjacent the lower surface of the table to hold the body of the power system within the aperture.

In an implementation, the retraining bracket 30 also includes spring tabs 36 which extend above the top surface 34 of the retaining bracket. The spring tabs 36 are designed to engage the lower surface of the flat surface when the retaining bracket is adjacent the lower surface of the table to pull the supporting undersurface 28 of the edge of the body 16 into secure engagement with the top surface of the table. By providing the spring tabs 36, the retaining bracket 30 may securely hold the power system within the aperture even if there is some minor discrepancy between the thickness of the table top and the possible locations of the retaining bracket given the placements of the detents on the body 16 relative to the undersurface 26.

In an implementation the friction elements 32 are provided on tabs 38 formed on body 16 which may flex inward into the body 16 to release engagement between the friction elements 32 on the body 16 and the friction elements on the retaining bracket. Tabs 38, in this implementation, facilitate release of the retaining bracket 30 from the body, for example if the body is to be removed from the flat surface (e.g. table top) in which it has been mounted.

Power in-Feed and Connectors

Figure 7:
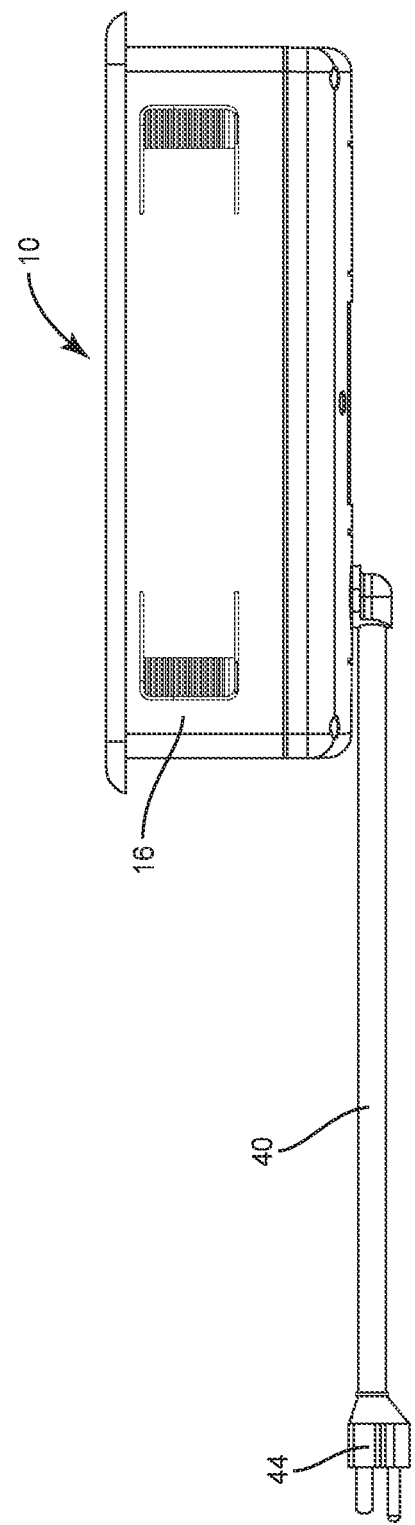
FIGS. 7-9 are side views of an example power system with different cord configurations.
Figure 8:
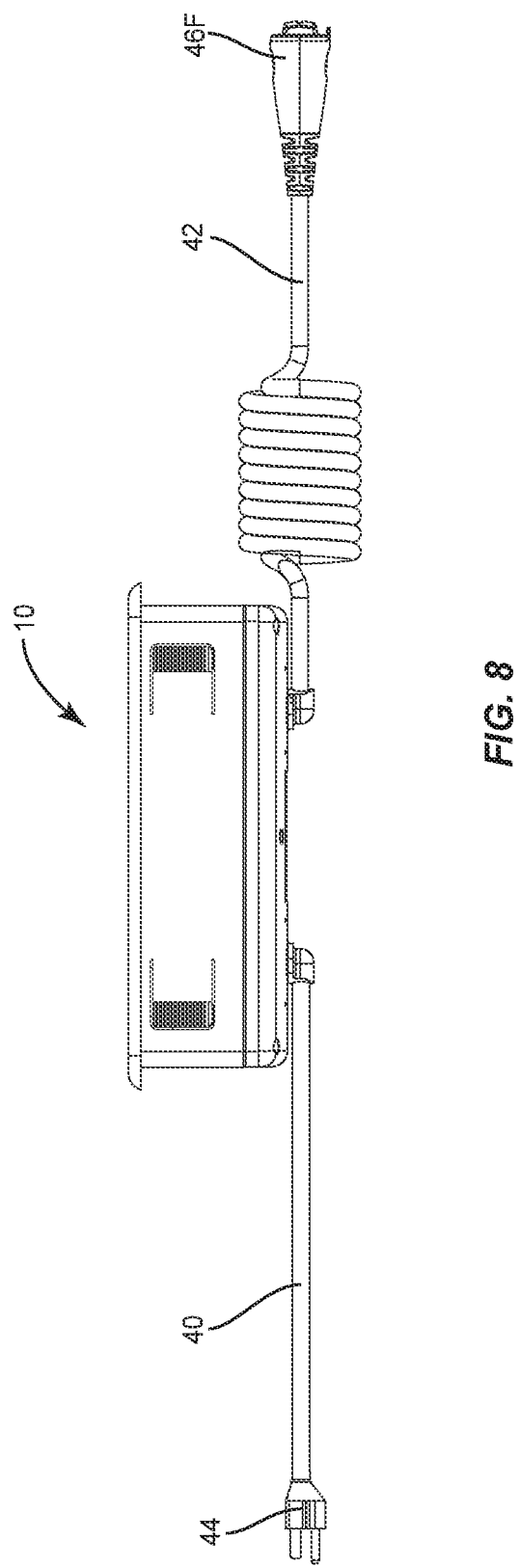
Figure 9:
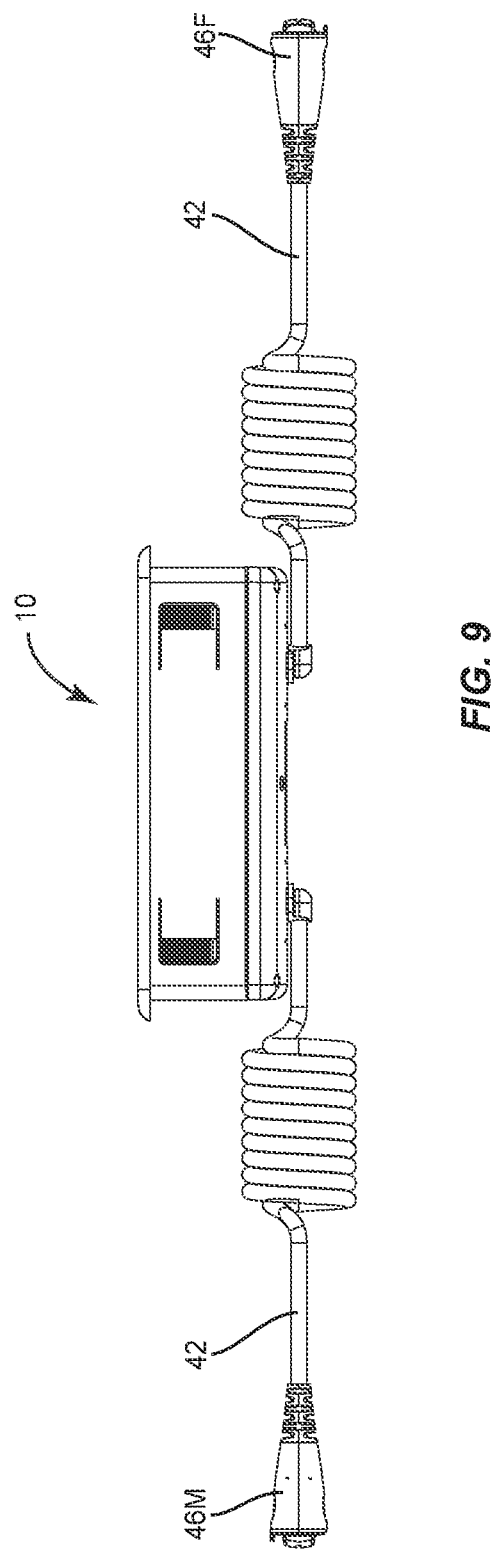

FIGS. 1-5 show an example power system having detachable power cords, in which detachable connectors enable the power cords to be attached and detached from the body of the power system. The detachable connectors will be described in greater detail in connection with FIGS. 11-18. FIGS. 7-9 show the example power system in which power cords 40 are directly connected to the power system. Power input cord 40 enables the power system to be connected to wall power and power interconnect cord 42 enables the power system to interconnect with similar other power systems. Different implementations may have different combinations of power input and interconnect cords. For example, as shown in FIG. 7, the power system may have one power input cord and no power interconnect cords. FIG. 8 shows an implementation in which the power system has both a power input cord 40 and a power interconnect cord 42. FIG. 9 shows an implementation in which the power system has two power interconnect cords.

Figure 10:
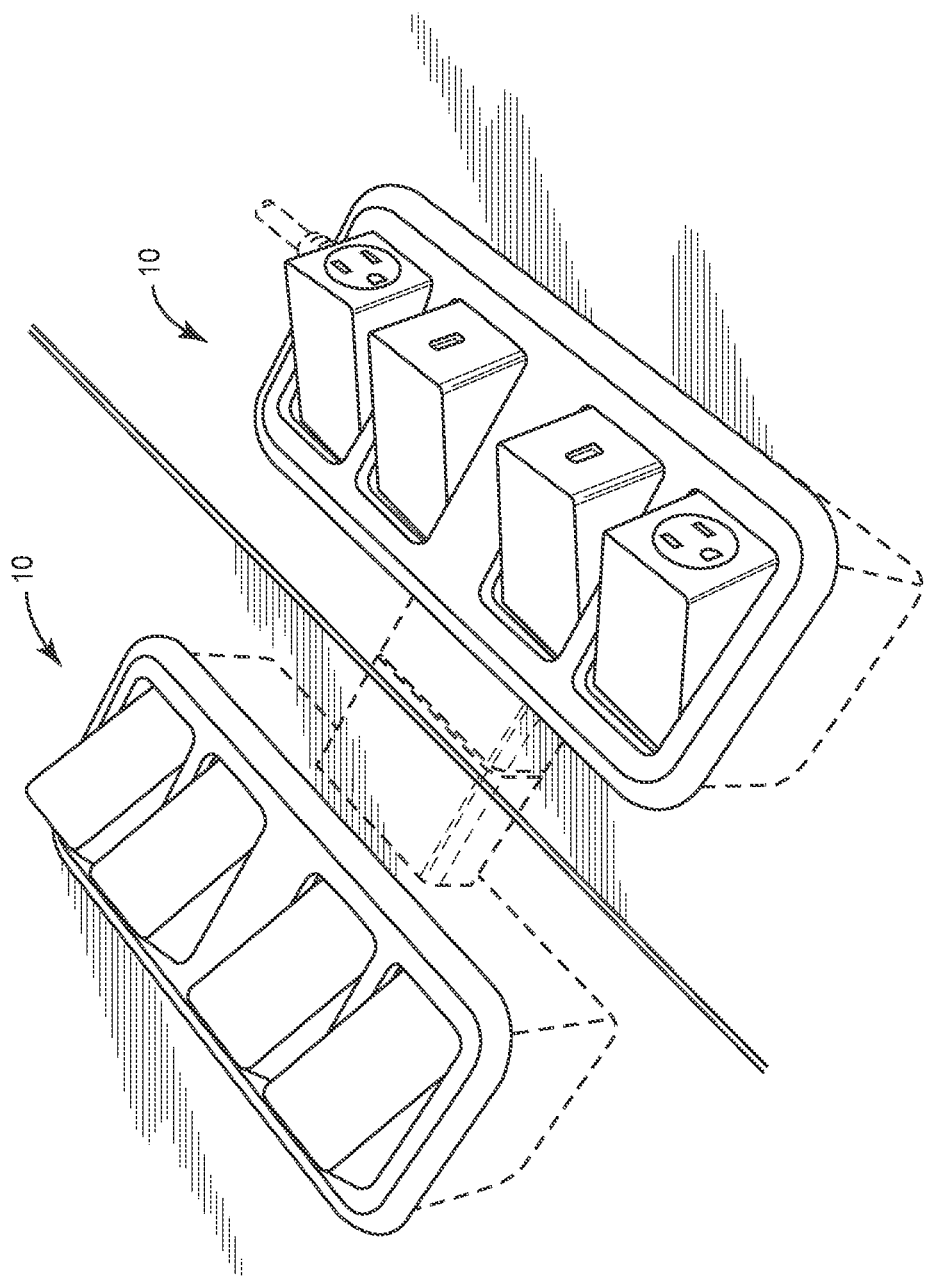
FIG. 10 is a perspective view in partial see-through showing two power systems in adjacent surfaces connected together.

Other configurations are likewise possible. For example, FIG. 10 shows an implementation in which two similar power systems are disposed in separate powered surfaces such as table tops. As shown in FIG. 10, the connectors in the middle of the power system enables the powered surfaces to be directly connected to each other without requiring the use of a power interconnect cord to transfer power from one power system to another. In another implementation a power interconnect cord may be used to interconnect the power systems instead of having the power systems directly connect. Where two surfaces are directly connected, as shown in FIG. 10, the middle connectors may be designed to move relative to the body to enable a mismatch in alignment between the surfaces to be accommodated.

FIG. 7 shows a power system with a power input cord 40. An outlet plug 44 is provided on the end of the power input cord 40 to connect to a standard wall outlet. Differently shaped outlet plugs 44 may be used for different countries depending on the particular shape of the female wall outlet in the country where the power system is to be used.

FIG. 8 shows a power system with a power input cord 40 and a power interconnect cord 42 designed to interconnect the power system 10 with similarly configured power systems. The power interconnect cord 42 has a connector 46F on its end. Because power input cord has a outlet plug 44 that is a male connector, power interconnect cord 42, which is designed to conduct power away from the power system to provide power to other similarly configured power systems, has a female connector 46F.

FIG. 9 shows an implementation of a power system with two power interconnect cords 42. To ensure that power only flows in one direction, the implementation shown in FIG. 9 has a male connector 46M on one end and a female connector 46F on the other end. By using male and female connectors, as shown in FIGS. 8 and 9, power may only be connected to a chain of power systems from one side (the male side) to thus prevent power from being provided to a given chain of interconnected power systems from more than one wall outlet. An implementation of the male and female connectors is provided in greater detail below.

Although the implementation shown in FIGS. 8-9 shows the connectors 46 only on ends of the power interconnect cords, in another implementation as shown in FIGS. 1-5, male and female connectors 46 may be formed directly on the body of the power system. In this implementation, the power input cord would have a female connector 46F on an end opposite the outlet plug 44. The power system 10, in this implementation, includes a male connector 46M formed on the body 16. To prevent power from being input to the power system from more than one source, a given power system will have at most one male connector 46M. The power system may have one or more female connectors 46F formed on the body to allow power to be supplied from the power system to one or more similarly configured power systems via a power interconnect cord having one male end and one female end.

Figure 11:
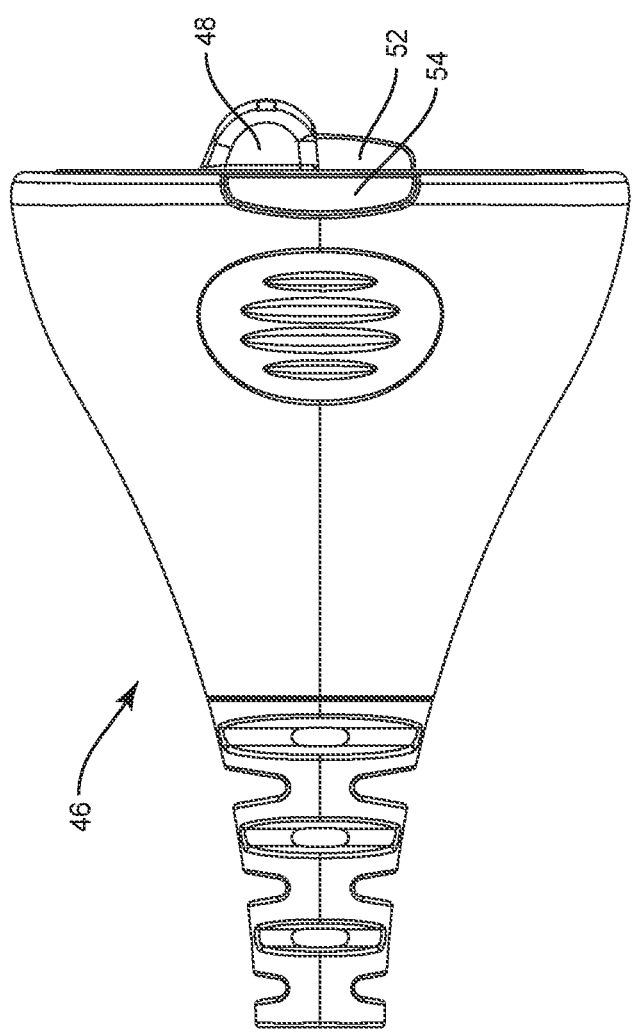
FIGS. 11-15 are views of an example female connector for use with an example power system.
Figure 12:
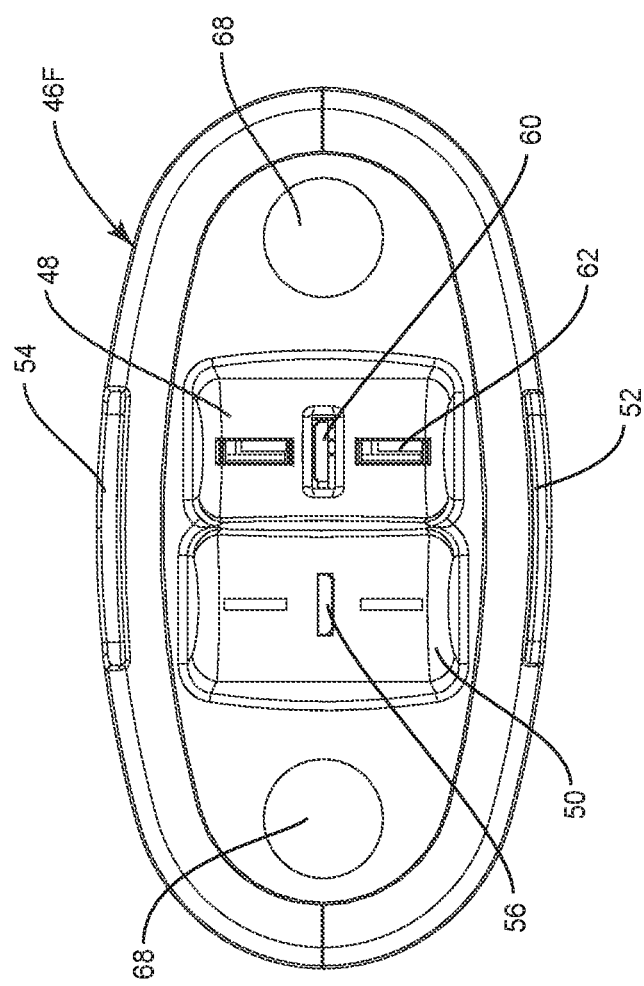
Figure 15:
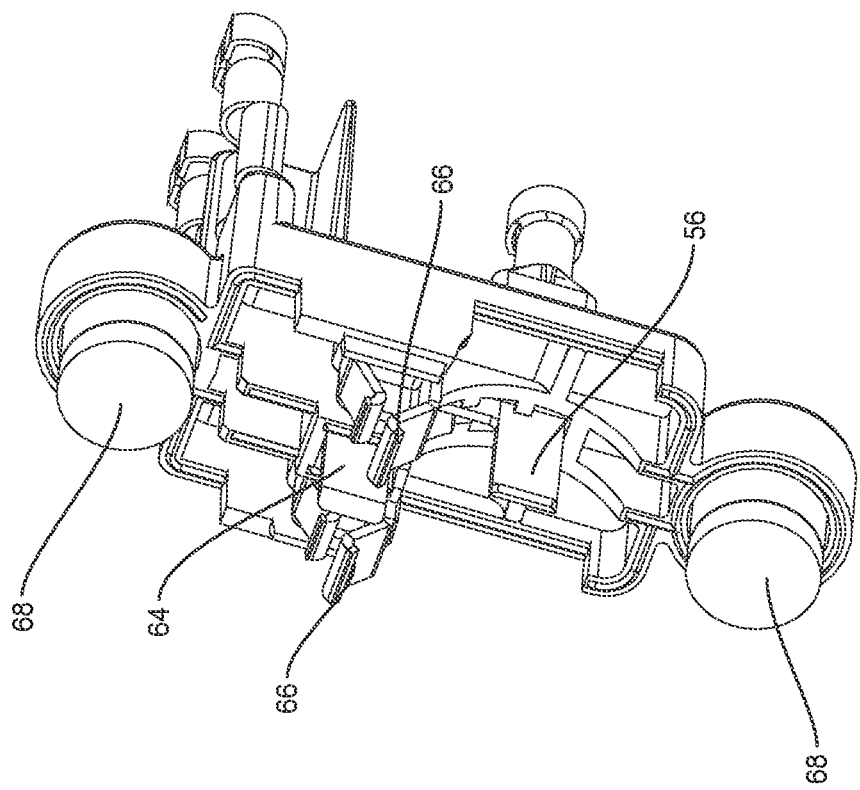
Figure 16:
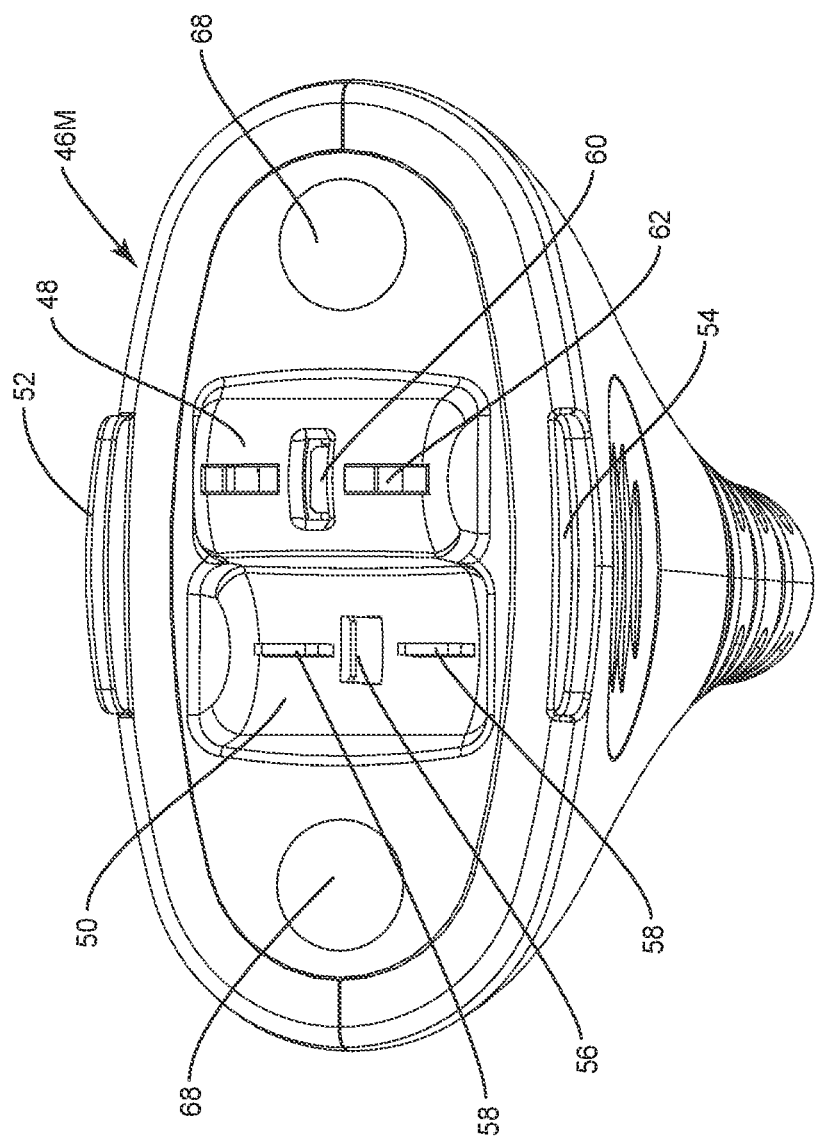
FIGS. 16-18 are views of an example male connector for use with an example power system.
Figure 17:
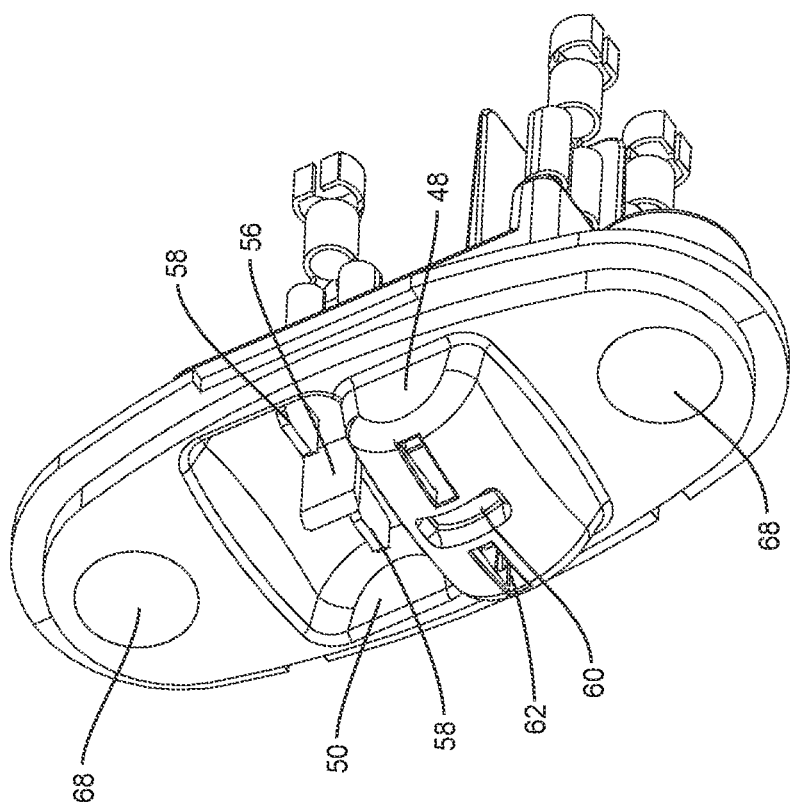
Figure 18:
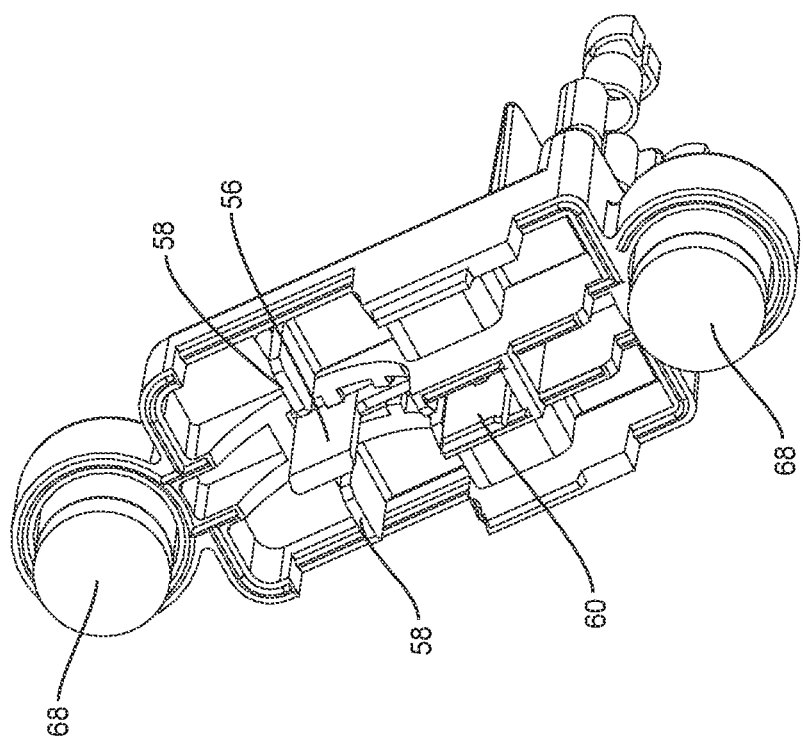

FIGS. 11-18 show an implementation of the connector 46, in which FIGS. 11-15 show an example female connector 46F and FIGS. 16-18 shows an example male connector 46M. FIG. 11 shows a side view of the connector, and FIG. 12 shows an end view of the connector. As shown in FIGS. 11-15, the connector 46 includes a protrusion 48 formed as a convex surface and a recess 50 formed as a concave surface. Protrusion 48 is sized to fit within recess 50 of a mating connector. Both male and female versions of the connector 46 include identically shaped protrusion 48 and recess 50. This allows the male and female connectors to nest when mated.

Because male and female connectors are identically shaped, it is possible for two female connectors to be connected together. However, as discussed below, the male and female connectors have differently numbers of electrical prongs extending from a surface of the connector which prevents power from being transferred between mated female connectors.

Figure 13:
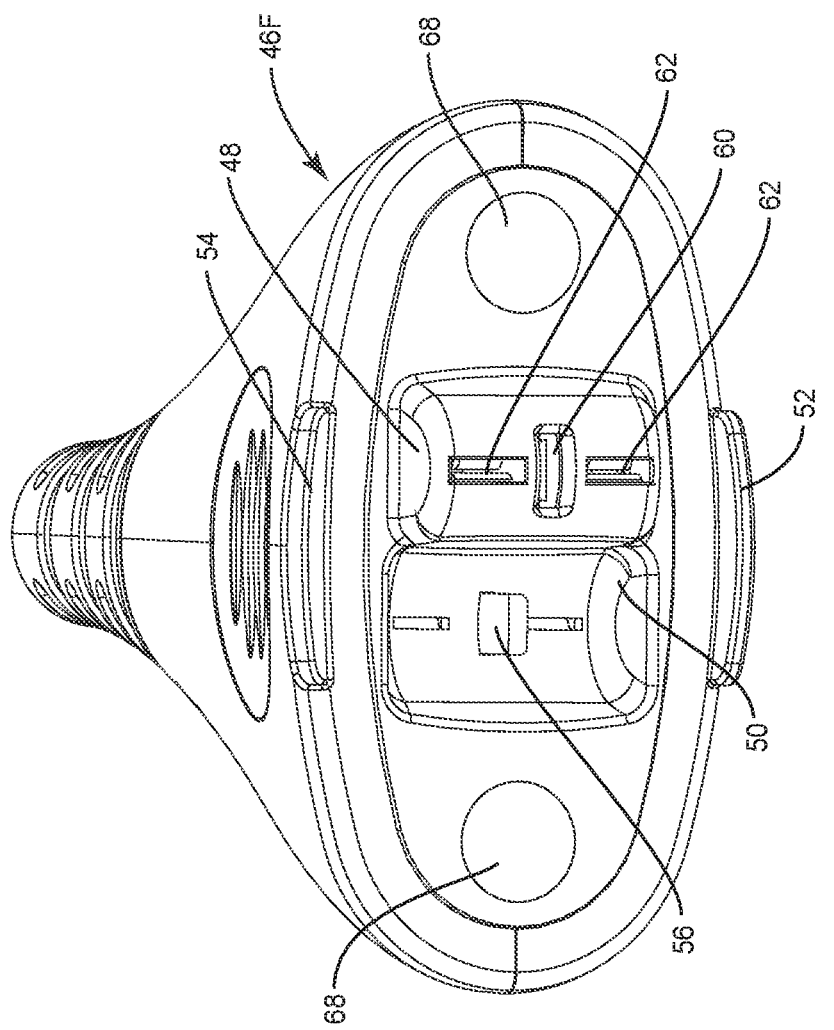
Figure 14:
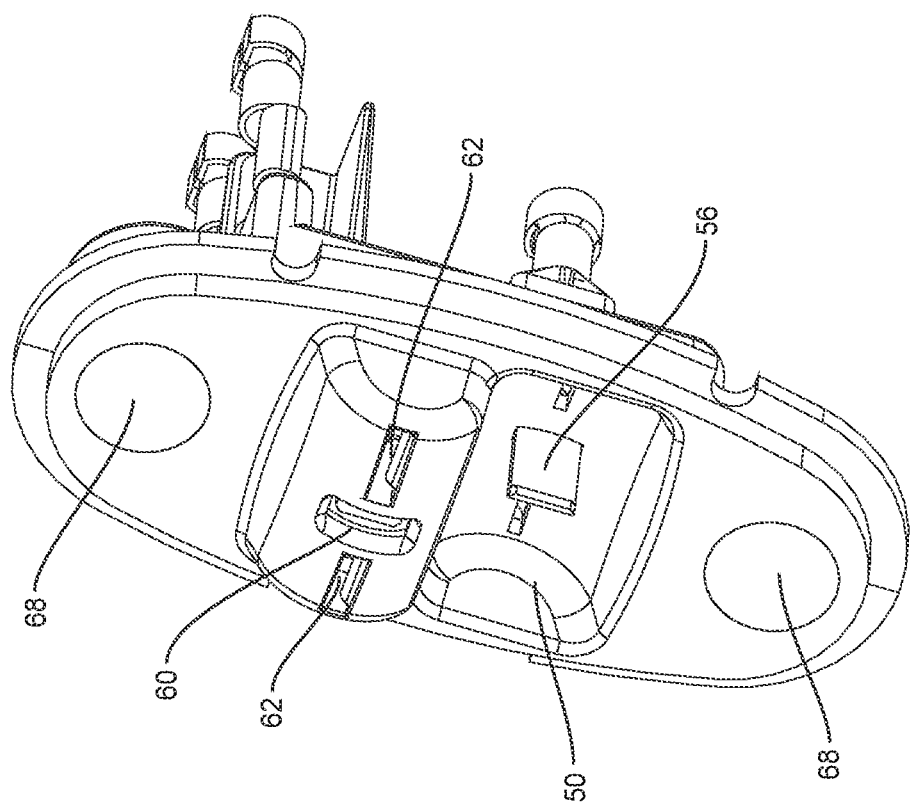

In addition, to prevent two female connectors from accidentally being physically joined together, or to prevent two male connectors from accidentally being joined together, in one implementation the male connector 46M and female connector 46F additionally include tab 52 and indent 54 which are oppositely located on the female and male versions of the connector 46. In one implementation, as shown in FIGS. 12-13, the female connector is formed to have a tab 52 that is located on the bottom of the connector when the connector is oriented such that the protrusion 48 is on the right-hand side of the connector when viewed from the end. In the male version of the connector, as shown in FIG. 16, the tab 52 is located on the top of the connector when the connector is oriented such that the protrusion 48 is on the right-hand side of the connector when viewed from the end. In both the male and female versions of the connector, a corresponding indentation 54 is formed on an edge opposite tab 52. Indentation 54 is designed to receive the tab 52 of a respective connector when the male and female connectors are interconnected.

When the female connector of FIG. 13 and male connector of FIG. 16 are connected, the top tab of the male connector will fit into the top indent of the female connector. Likewise the bottom tab of the female connector will fit into the bottom indent of the male connector. Hence, female and male connectors can interconnect. An implementation of the connector without tab 52 and indent 54 would allow physical interconnection of two female connectors or two male connectors. However, the protruding hot/neutral contacts of the male connector 46M are not live until the male connector is inserted into a female connector. Hence, even in an implementation without the tab and indent, interconnection of two male connectors will not allow power to be supplied to the power system from more than one wall outlet. Likewise, an implementation of the connector without the tab and indentation would allow two female connectors to be physically connected. However, the lack of protruding hot/neutral contacts of the female connector would prevent power from being transmitted between the female connectors. The tab and indentation, therefore, do not prevent transmission of power between the connectors, but rather help the user to not accidentally interconnect two male connectors or two female connectors.

In addition to the differing location of the tab and indentations, the female connector shown for example in FIGS. 12-15, has a ground contact 56 extending from the surface of the connector but does not have hot or neutral contacts extending from the surface. As discussed above, since power is provided to the power system by plugging an outlet plug 44 into a wall outlet, and female connector 46F is on the end of a power interconnect cord 42 extending from the power system, when power system is connected to wall power the contacts within the female connector 46F will be live, meaning that power will be available at the contacts. Forming the female connector to have the hot/neutral contacts behind the exterior surface of the connector prevents a person from coming into contact with these live contacts.

The male connector, by contrast for example as shown in FIGS. 16-17, has ground contact 56 as well as hot and neutral contacts 58 extending beyond a surface of the connector. These protruding contacts will pass through respective ground slot 60 and hot/neutral slots 62 of mating female connector when the male and female connectors are interconnected.

In an implementation, ground contact 56 of female connector 46F extends from recess 50 of the female connector. Likewise, ground contact 56 and hot and neutral contacts 58 of male connector extend from recess 50 of the male connector. ground slot 60 and hot/neutral slots 62 are formed in protrusion 48 in both male and female versions of the connector.

FIGS. 11-13 and 16 show the surface features of the connector 58 and FIGS. 14-15 and 17-18 show internal features of the connector with the outer skin removed. As shown in FIG. 15, in the female version of the connector 46F, ground contact 64 is disposed behind ground slot 60 to interconnect with ground contact 56 of a mating connector. Hot and neutral contacts 64 are likewise disposed behind hot and neutral slots 62 to interconnect with hot/neutral contacts 58 of a mating connector. Contacts 64, 66 may be formed, for example, of brass, and are electrically isolated from each other within the connector 46. Female connector has only one protruding contact—ground contact 56—which is electrically interconnected to ground contact 64.

FIGS. 17-18 show the internal features of a male version of the connector with the outer skin of the connector removed. As shown in FIG. 18, the male version of the connector is not expected to receive hot/neutral contacts 58 via hot/neutral slots 62. Thus, unlike the female version, the male version of the connector does not include hot/neutral contacts 66. To enable ground connection to be redundant, the male connector does include a ground contact 64 disposed behind the ground slot 60. Male connector has three protruding contacts, ground contact 56, and hot/neutral contacts 58, which are designed to extend beyond the surface of the connector. Contacts 58, 58 may be formed, for example, of brass and are electrically isolated from each other within the connector 46.

In one implementation the ground contact 56 is provided to be longer than the hot and neutral contacts 58 to enable ground contact 56 to electrically connect with ground contact 65 of a mating connector when the ground contact 56 and hot/neutral contacts 58 extend through ground slot 60 and hot/neutral slots 62 of the mating connector.

In one implementation, magnets 68 are provided on either side of protrusion 48 and recess 50 to provide attractive force to cause mating pairs of connectors to be attractively coupled when placed in proximity of each other. In one implementation one of the magnets has a south polarity and the other of the magnets has a north polarity. Magnets 68 may be formed from neodymium or other permanently magnetic material. In another implementation, magnets 68 are electromagnetic and are attractive when power has been connected to the power system.

Power Distribution System

Figure 19:
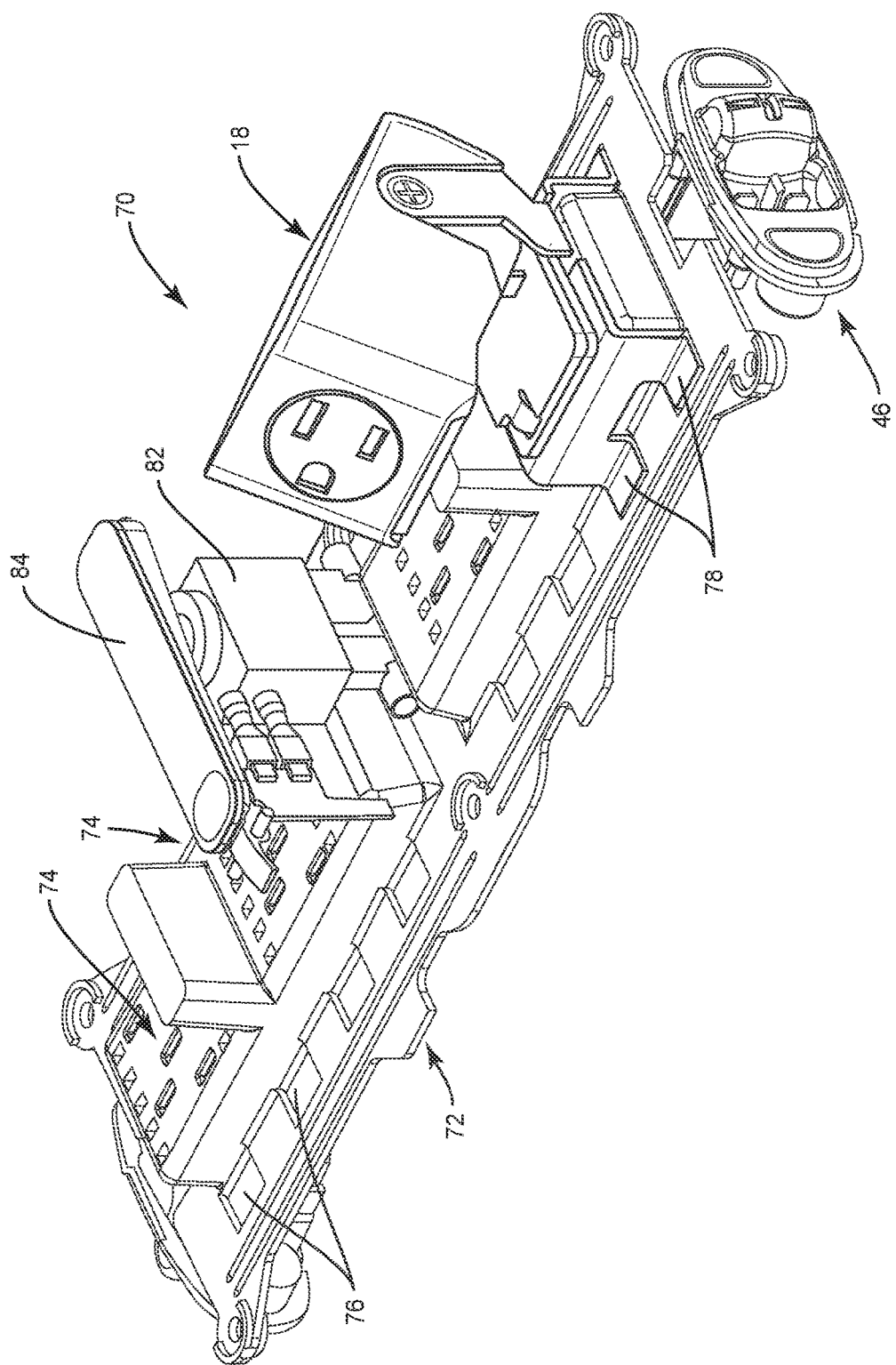
FIGS. 19-21 are views of an interior of an example power system.
Figure 20:
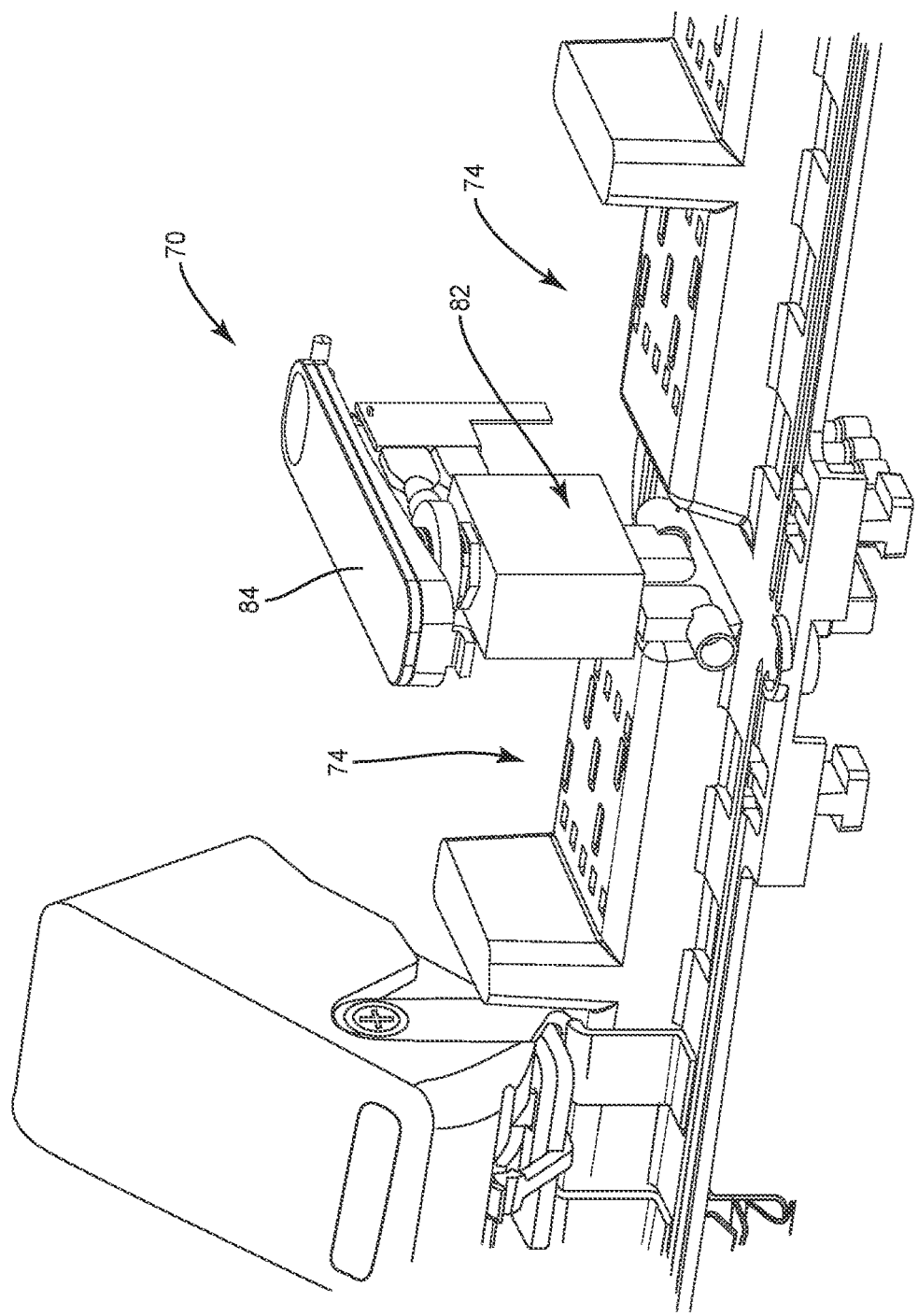

FIGS. 19-23 show a power distribution system 70 of an example power system. The power distribution system shown in FIGS. 19-23 is designed to be contained within the housing 12 of the power system discussed in connection with FIGS. 1-9. In the implementation shown in FIGS. 19-23, the power distribution system 70 has a chassis 72 with raised connector areas 74 and support areas 76. As shown in FIG. 19, each of the raised connector areas 74 is configured to receive one of the modular power components 18. An implementation of the modular power components is described in greater detail below in connection with FIGS. 24-30. In an implementation, feet 78 of the modular power components are received in the support areas 76. A locking mechanism, discussed in greater detail below in connection with FIGS. 33-37 is used to selectively hold the feet in the support areas to allow the modular power components to be secured within the power system.

Figure 22:
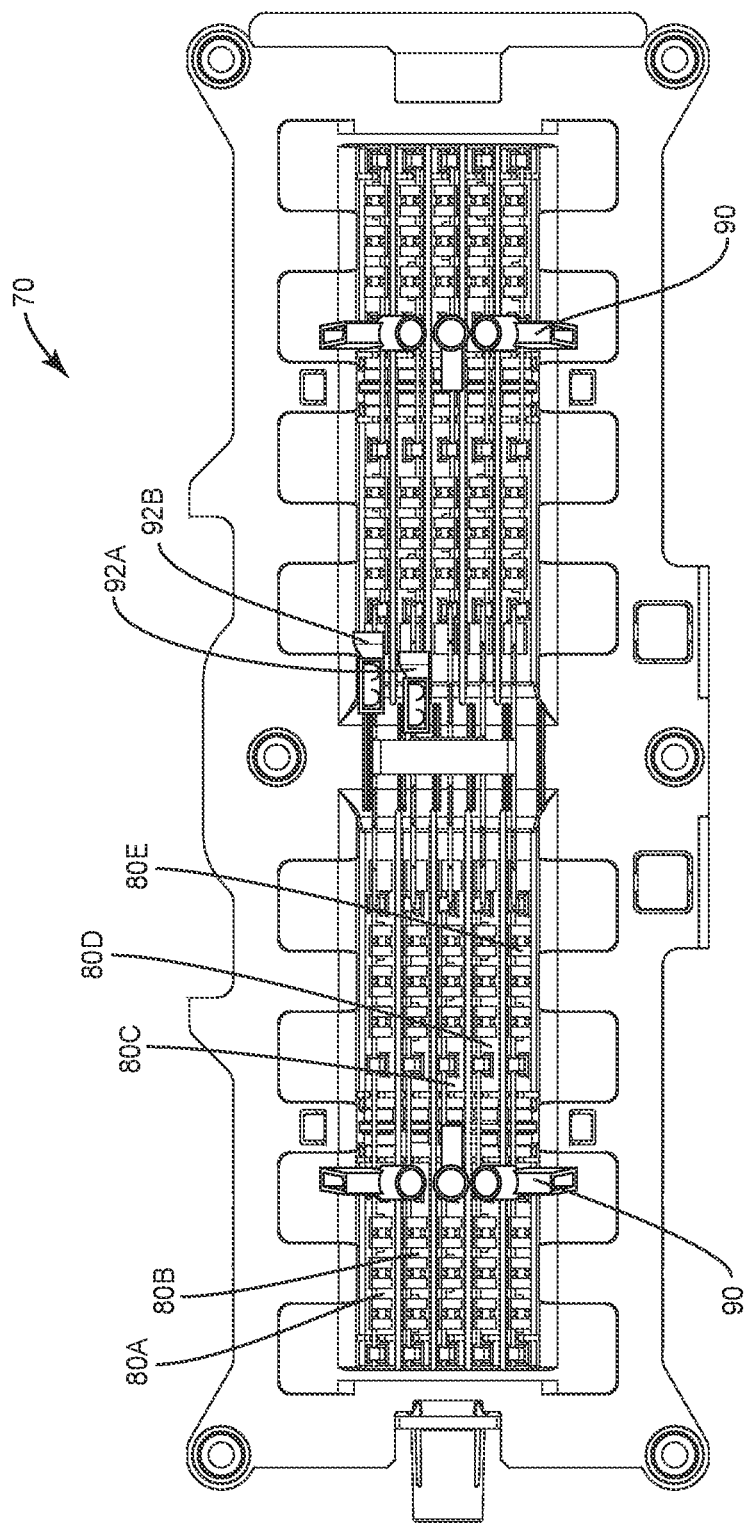
FIGS. 22-23 are views of a power distribution system of an example power system.
Figure 23:
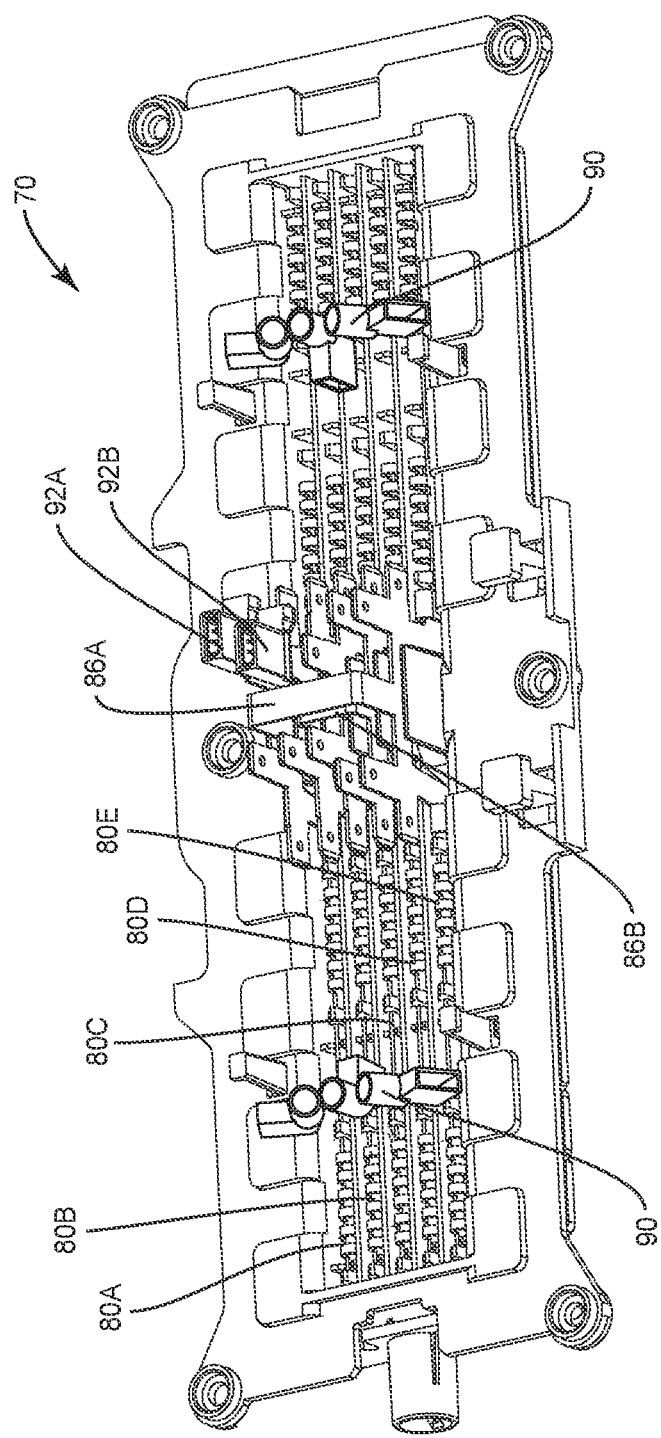

FIGS. 22-23 show an underside of the chassis 72. As shown in FIGS. 22-23, the underside of the chassis holds five power conductors 80A-80E. Power conductors 80A-80E are designed as power bus bars to convey high voltage power, e.g. 110 Volt AC power, within the power distribution system. The particular voltage levels on the power bus bars will depend on the electrical system in use in the particular country. For example, in North America the standard voltage level provided at a wall outlet is 110 volts. In Europe and elsewhere normal power levels are often 220 volts. The power conductors 50 are designed to conduct standard power received from a wall outlet to make the power available within the power distribution system.

Optionally, in an implementation, an overcurrent protection circuit 82 is connected between the power system power source and the power conductors 50A-50E. The overcurrent protection circuit 82 is configured, in an implementation, to disconnect power to one or more of the power conductors 50A-50E upon detection of dangerous conditions on the one or more power conductors. A reset button 84 (see FIG. 1) may be provided flush with the top surface 14 of the power system. In this implementation, the event of an overload condition or other dangerous power condition on one or more of power conductors 80A-80E, the electronic overcurrent protection circuit 82 within the power system will trip, preventing current from being provided to the modular power components via power conductors 80A-80E. In this event, reset button 84 will pop up above top surface 14. When the condition causing the overload has been rectified, the reset button 84 may be pressed to cause the electronic overcurrent protection circuit within the power system to be reset. In this manner the electronic overcurrent protection circuit 82 and reset button 84 functions as a Ground Fault Interrupt (GFI) to prevent overcurrent conditions from occurring at power conductors 80A-80E, and hence prevents this condition from occurring at the electrical outlets 24 provided in modular power components 18.

In the implementation shown in FIGS. 22-23, power conductor 80A is connected to power conductor 80E by jumper 86A. Power conductor 80B is connected to power conductor 80D by jumper 86B. In an implementation, power conductors 80A and 80E are connected to hot, power conductors 80B and 80D are connected to neutral, and power conductor 80C is connected to ground. Other implementations may change which conductors are used to provide hot, neutral, and ground.

Figure 21:
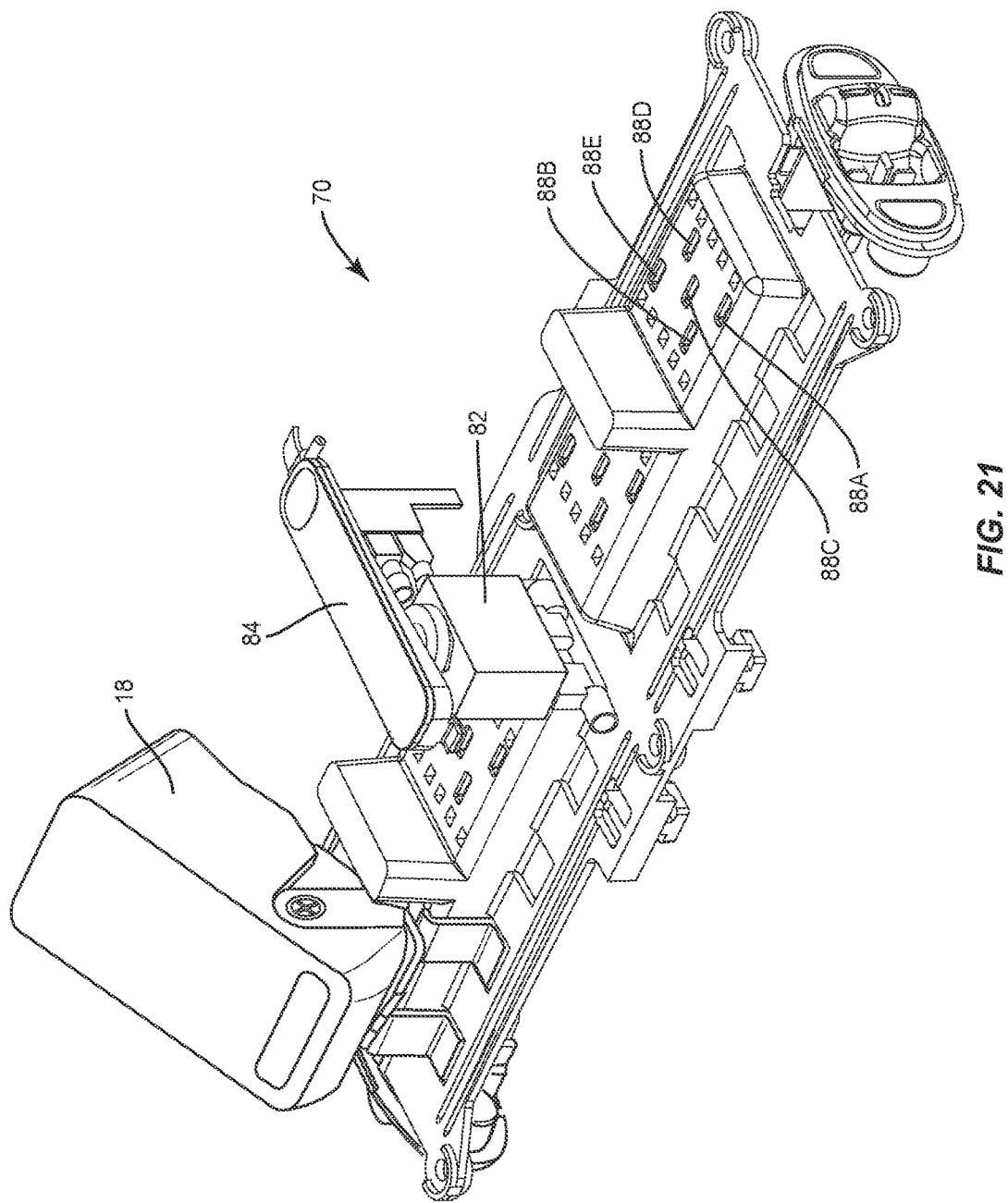

As shown in FIG. 21, each raised connector area 44 contains 5 connector slots 88A-88E disposed generally above power conductors 80A-50E to permit access to the power conductors from the raised area. Connector slot 88A enables a first prong from modular power component 18 to engage power conductor 80A. Connector slot 88B enables a second prong from modular power component 18 to engage power conductor 80B. Connector slot 88C enables a third prong from modular power component 18 to engage power conductor 80C. Connector slot 88D enables the second prong from modular power component 18 to engage power conductor 80D when the modular power component is oriented in the opposite direction. Connector slot 88E enables the first prong from modular power component 18 to engage power conductor 80E when the modular power component is oriented in the opposite direction.

By providing connector slots that are symmetric about a center line, a set of three connector prongs from modular power component 18 are able to selectively engage a first set of connectors 80A, 80B, 80C, or a second set of connectors 80C, 80D, 80E depending on the orientation of the modular power component within the modular power supply. Accordingly, the same modular power component can be inserted onto the chassis and provide power at the surface of the power system in two orientations. Since each raised connector area 74 has a set of five slots, the orientation of each modular power component is independent of the orientation of the other modular power components.

Although an implementation with five power conductors (2 hot, 2 neutral, and 1 ground) has been shown, other numbers of power conductors may be used in other implementations. For example, an implementation may include two ground conductors. Likewise, although in the implementation shown in FIGS. 22-23 the power conductors are implemented as bars, alternative implementations may provide other types of power conductors to supply power at connector slots 88. Example implementations may include wires and other power conductor implementations to enable power to be provided at slots 88.

In the implementation shown in FIG. 19, power is received by the power system at connector 46. Wires (not shown) connect contacts 64, 66 of female connector 46F to power conductors 80. In the implementation shown in FIGS. 7-8, where power input cord 40 is directly connected to the power system 10, wires within power input cord 40 are connected to the power conductors 80 via tabs 90. A second set of tabs is provided to connect to wires of power interconnect cord 42. In this implementation, the overcurrent protection circuit 82 is connected to power conductors 80A, 80B via wires that connect to taps 92A, 92B.

Although an implementation has been described in which brass bars are used to implement power conductors 80, in another implementation different types of connectors such as wires may be used to interconnect power received on power input cord 40 and contacts formed behind slots 88.

In an implementation, the chassis 72 provides several additional functions in addition to providing for power distribution. For example, as shown in FIG. 19, the raised areas substantially cover the power conductors such that only the connector slots 88 provide access to the power conductors within the power system. Thus, if a modular power component is removed from the power system without disconnecting the power system from the wall outlet, a person is not able to accidentally contact the power conductors 80. This enables the modular power components 18 to be hot-swapped from the power system safely.

Further, the chassis 72 is configured to cause water spilled onto the power system to be directed away from the high voltage components. Particularly when the raised connector areas are occupied by modular power components, water will tend to drain away from the raised connector areas to drip down into the bottom of the body of the power system rather than being directed toward the power conductors 80. The body of the power system may be provided with drainage holes at the bottom surface if desired to allow moisture to run out of the body to prevent excessive water from pooling inside the body.

Modular Power Components

FIGS. 24-30 show two implementations of example modular power components 18. In the implementation shown in FIG. 25, the modular power component 18 has three prongs 94A, 94B, 94C. Prong 94A is designed to plug into connector slot 88A or 88E of FIG. 21 depending on the orientation of the modular power component 18 to connect to hot conductor 80A or hot conductor 80E. Prong 94B is designed to plug into slot 88B or 88D of FIG. 21 depending on the orientation of the modular power component 18 to connect to neutral conductor 80B or neutral conductor 80D. Ground prong 88C is designed to plug into the center slot 94C of FIG. 21 regardless of the orientation of the modular power component 18 within the power system to connect to ground conductor 80C. By forming two sets of slots 88A&E, 88B&D, 88C in each raised connector area 74, which align with prongs 94 of modular power component 18 in two 180 degree offset orientations, it is possible to cause the modular power component to be connected to power conductors 80 in both orientations without requiring adjustment of the power distribution system within the power system. By forming the conductor slots to be symmetric about a centerline of the chassis 72, the orientation of the modular power components may be changed while enabling the modular power components to still receive power from the electrical power distribution system.

Figure 24:
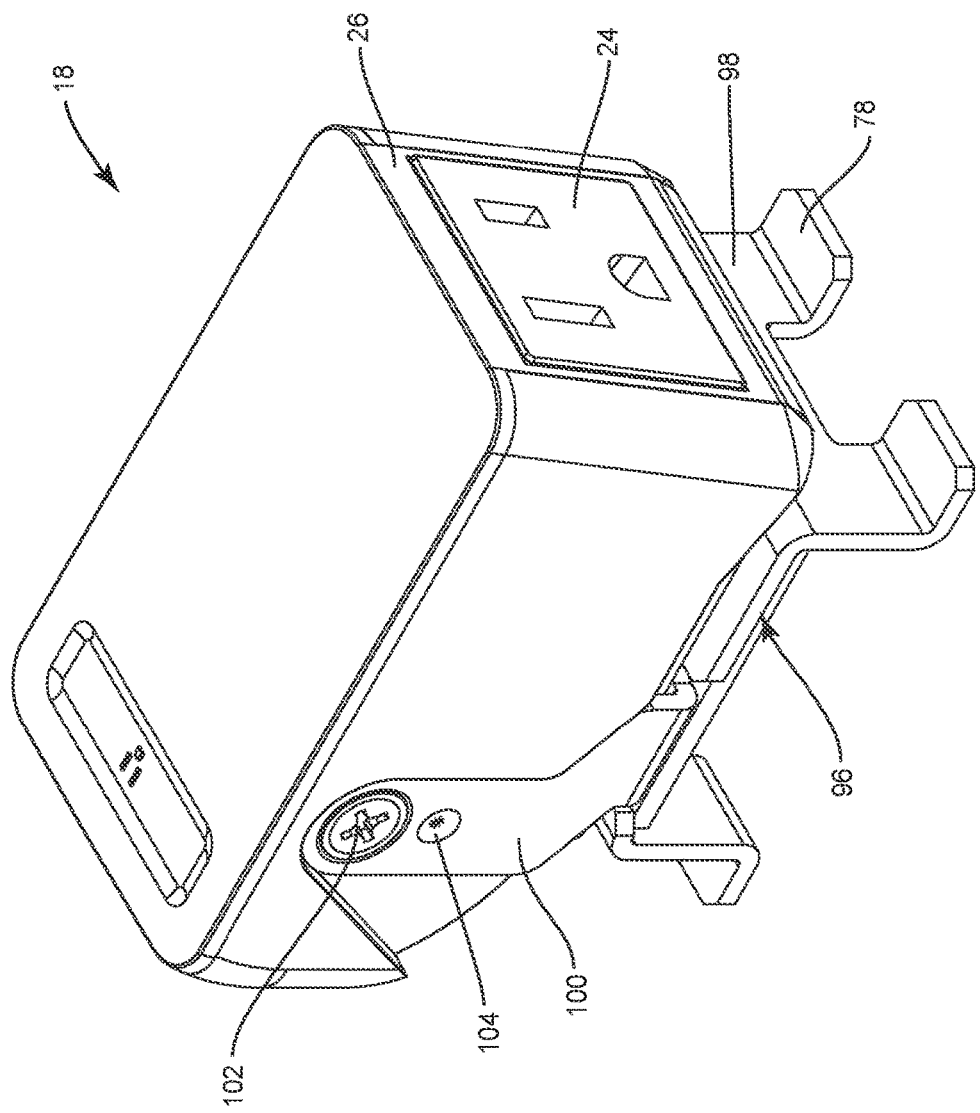
FIGS. 24-30 are views of example modular power components for use in an example power system.
Figure 25:
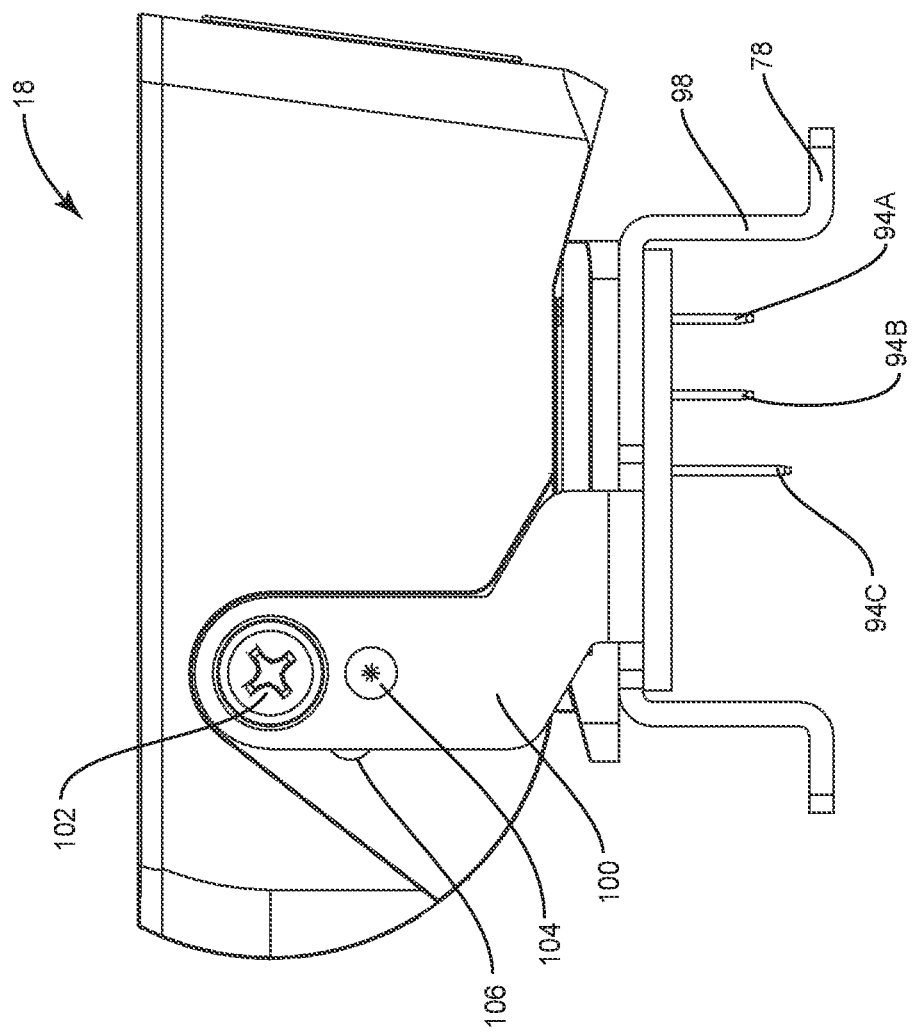

FIGS. 24-27 and 28-30 show two example modular power components in greater detail. As shown in FIG. 25, ground prong 94C is longer than hot and neutral prongs 94A, 94B. This allows the ground connection between the modular power component 18 and the ground conductor 80C to be created first so that the modular power component is grounded during the insertion and removal processes.

Each modular power component 18 has a frame 96 designed to support the modular power component. The frame 96 includes feet 78 supported by legs 98. Legs 98 extend down to straddle one of the raised connector areas 74 of chassis 72 when inserted into the power system.

Arms 100 extend up from frame 96 and include pivot 102. Pivot 102 supports the body of the module 18 to enable the body of the module to be rotated between the extended position shown in FIG. 3 to the retracted position shown in FIG. 1. FIGS. 24-30 show implementations of the module as they would appear in the retracted position. In an implementation, arm 100 includes protrusion 104 which forms a bump on the inside of arm 100 toward the body of the module (See FIG. 27). Two detents 106 are formed on the side walls of the module 18. A first of the detents 106 is positioned to be engaged by protrusion 104 in the retracted position. A second detent is positioned to be engaged by protrusion 104 in the extended position. The first detent, in FIG. 25, is hidden behind arm 100 and is positioned on the side wall of the module 18 directly behind protrusion 104. The second detent 106 is partially visible in FIG. 25.

Figure 28:
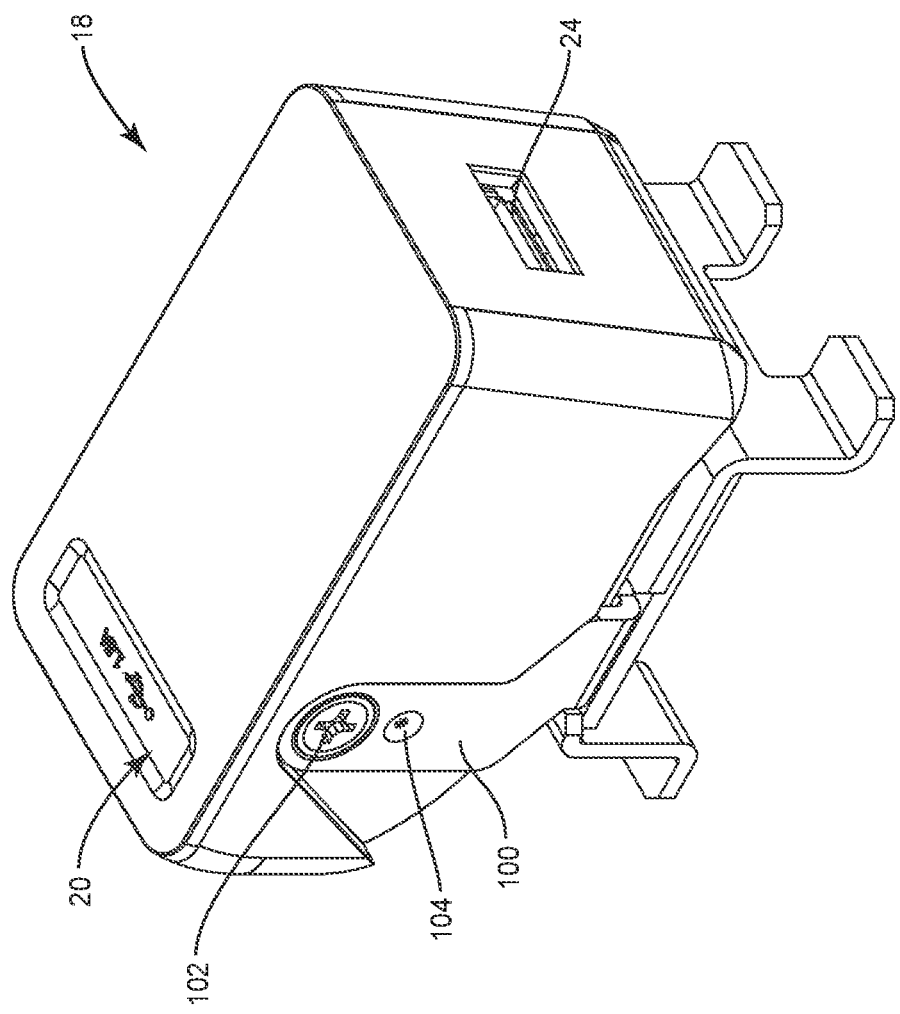

The module 86 may be designed to provide high power, e.g. line power, in which outlet 24 in face 26 is formed as an AC simplex female receptacle, for example as shown in FIG. 24. Likewise, the module 18 may be designed such that outlet 24 in face 26 is formed as a female USB connector, for example as shown in FIG. 28. In this implementation the module includes one or more printed circuit boards 108 to transform line current received via prongs 94 to a lower voltage, such as, for example 5V DC, as specified in one of the USB standards. The modular power components may also be configured in other ways to provide other functions. By forming the modular power components to have the same size, form factor, and electrical interconnection with the power system, different types of modular power connectors may be used within the power system body 16 without requiring modification of the power system. For example, a 5V DC USB module may be formed to be interchangeable with a 110V AC simplex module. This provides flexibility in reconfiguring the power system to enable the power system to provide the types of electrical connectors required for multiple applications.

Figure 26:
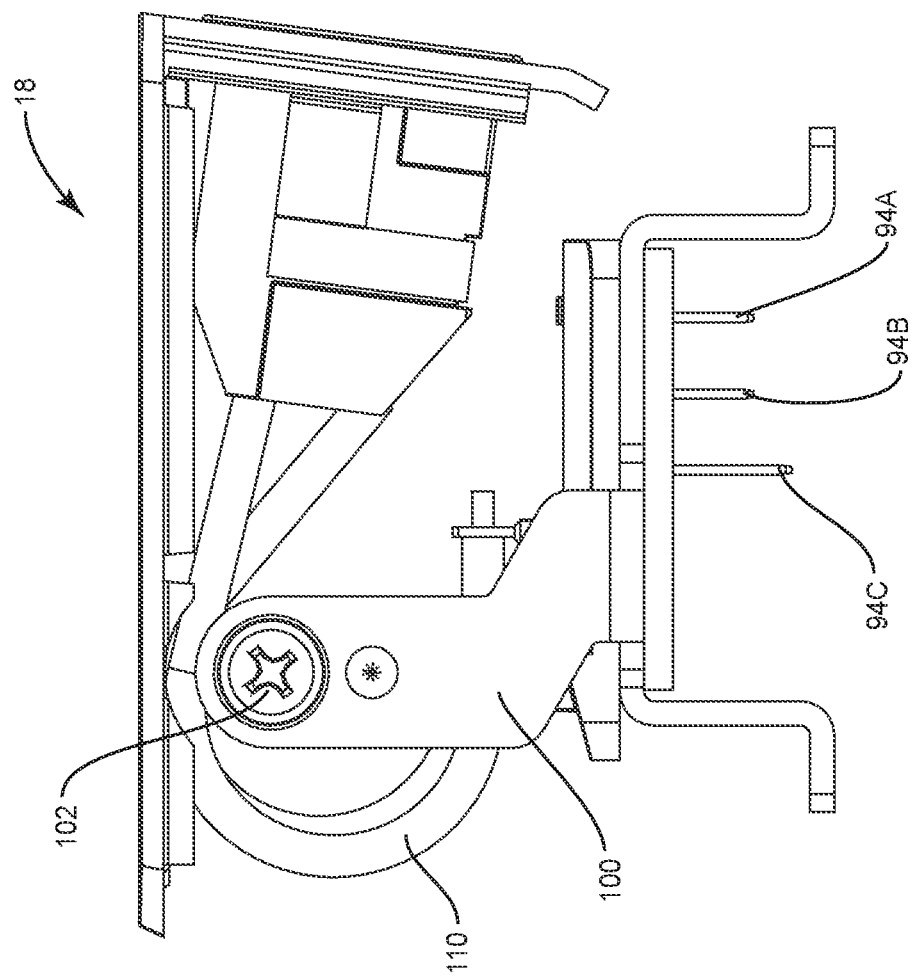
Figure 27:
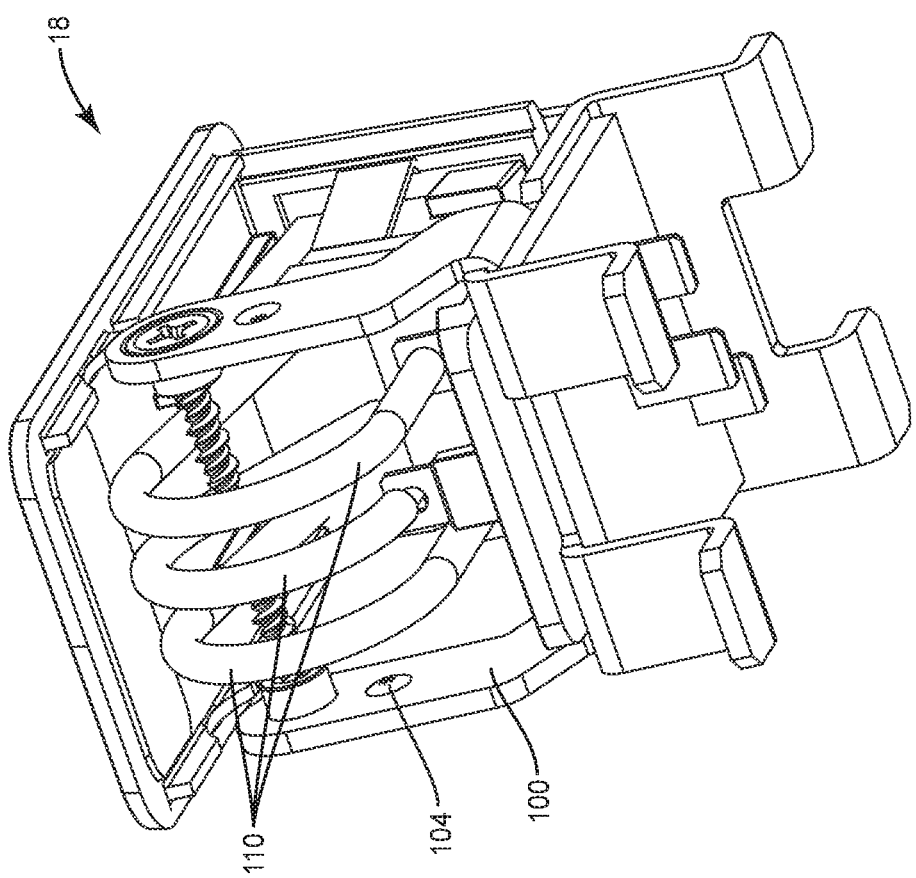

FIGS. 24-27 show an implementation in which an electrical outlet 24 is provided on face 26. FIG. 24 shows a front perspective view of this implementation, FIG. 25 shows a side view, and FIG. 26 shows a side view with the skin removed. As shown in FIG. 26, interior connections between the electrical outlet 24 and the prongs 94A, 94B, 94C may be implemented using wires 110. Alternatively this connection may be implemented in another manner depending on the implementation.

Figure 29:
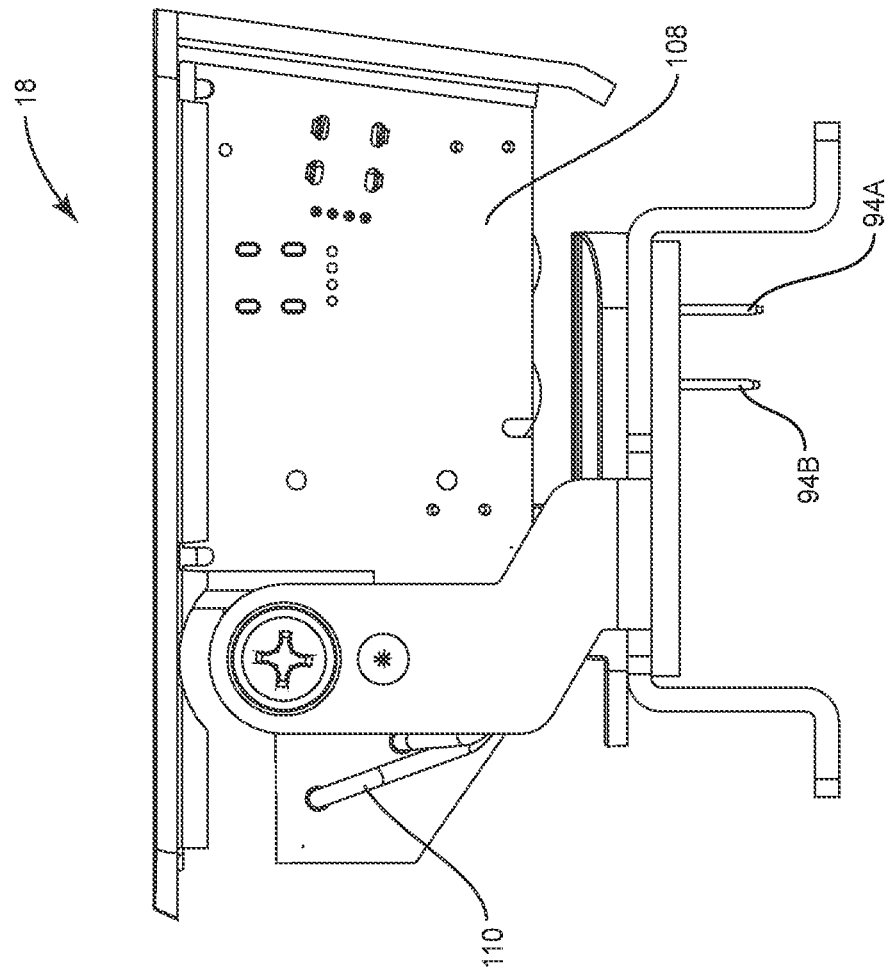
Figure 30:
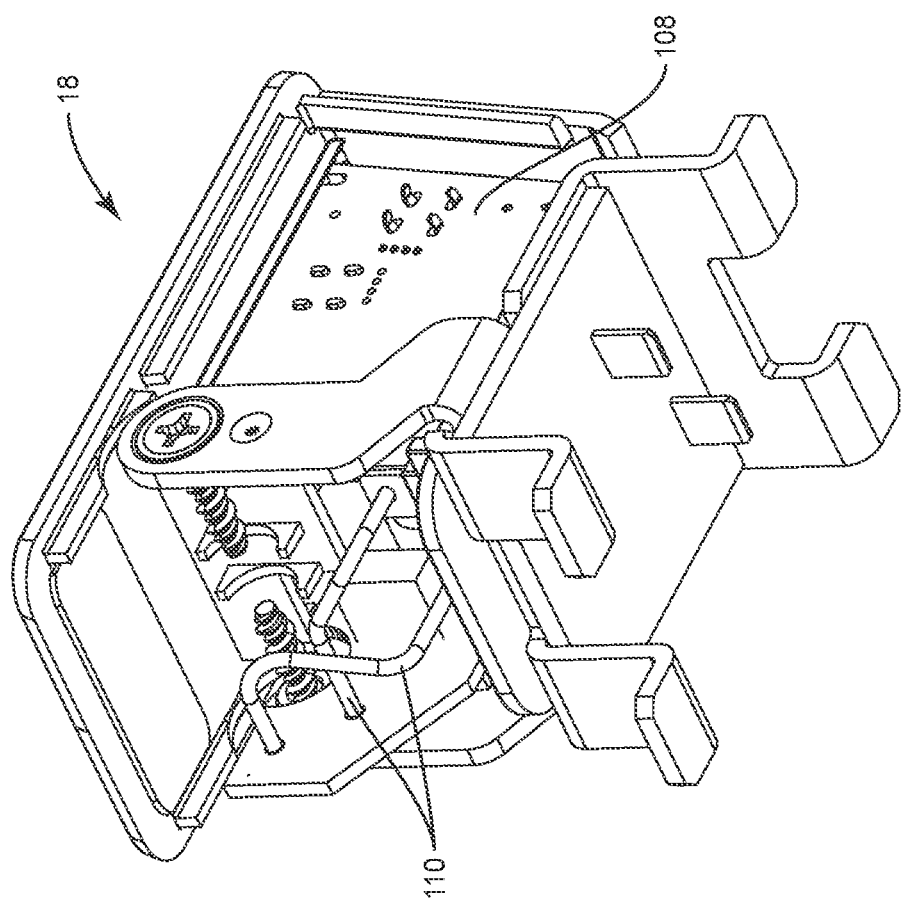

FIGS. 28-30 show a similar implementation configured to provide low voltage DC power, e.g. 5 VDC at 1.5 Amps, via a connector dimensioned to conform to one of the USB standards, e.g. a USB type A connector. Other connector shapes may likewise be provided. FIG. 29 shows the implementation of FIG. 28 from the side with the skin removed. As shown in FIGS. 29 and 30, wires 110 provide interconnection between prongs 94 and printed circuit board 108.

Figure 31:
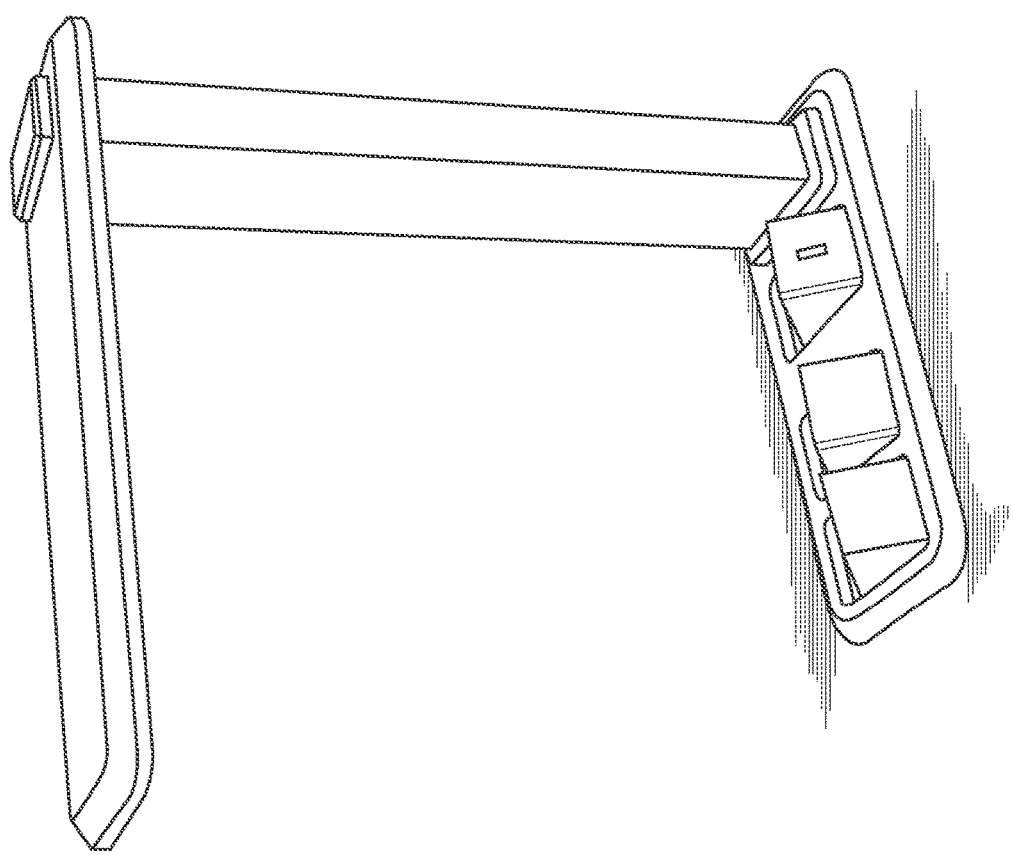
FIG. 31 is a perspective view of an implementation including a table lamp as a modular power component.

Although several implementations have been described which are configured to provide outlets within the modular power system, additional accessories may be utilized as well with the modular power system. For example, as shown in FIG. 31, a table lamp may be designed with a base that enables the lamp to connect to the power system. The lamp in this implementation is fixed relative to the base and extends through the aperture on the top surface 14 of the body of the power system. Additionally an articulating task lamp may be inserted into the base providing positionable lighting solutions. Likewise, a Bluetooth speaker or wireless power system 126 (See FIG. 32) may function without requiring the user to rotate the module to obtain access to the front surface of the module. Thus, it should be understood that whether modules designed for use with the power system rotate between an extended and retracted positions will depend on the function to be provided by the particular module.

Figure 32:
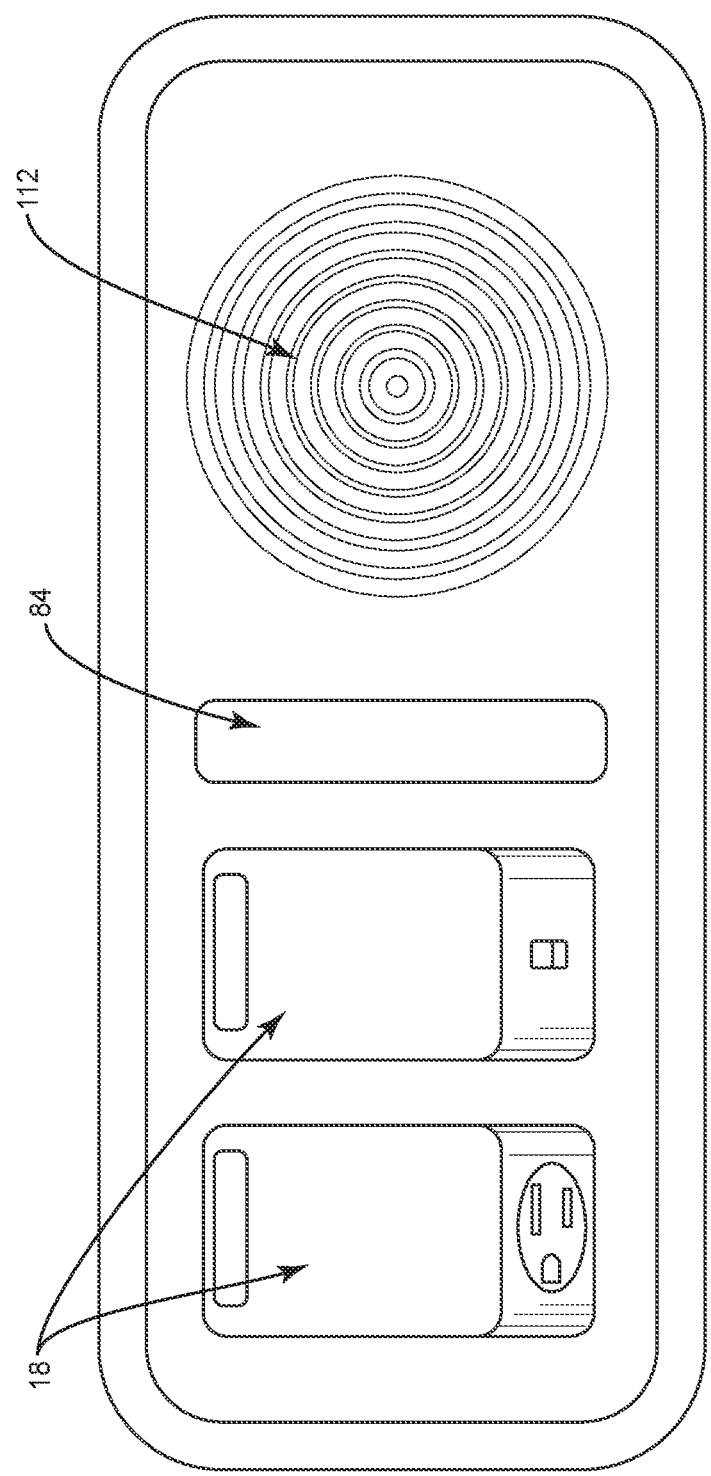
FIG. 32 is a top view of an example power system including a wireless power system.
Figure 33:
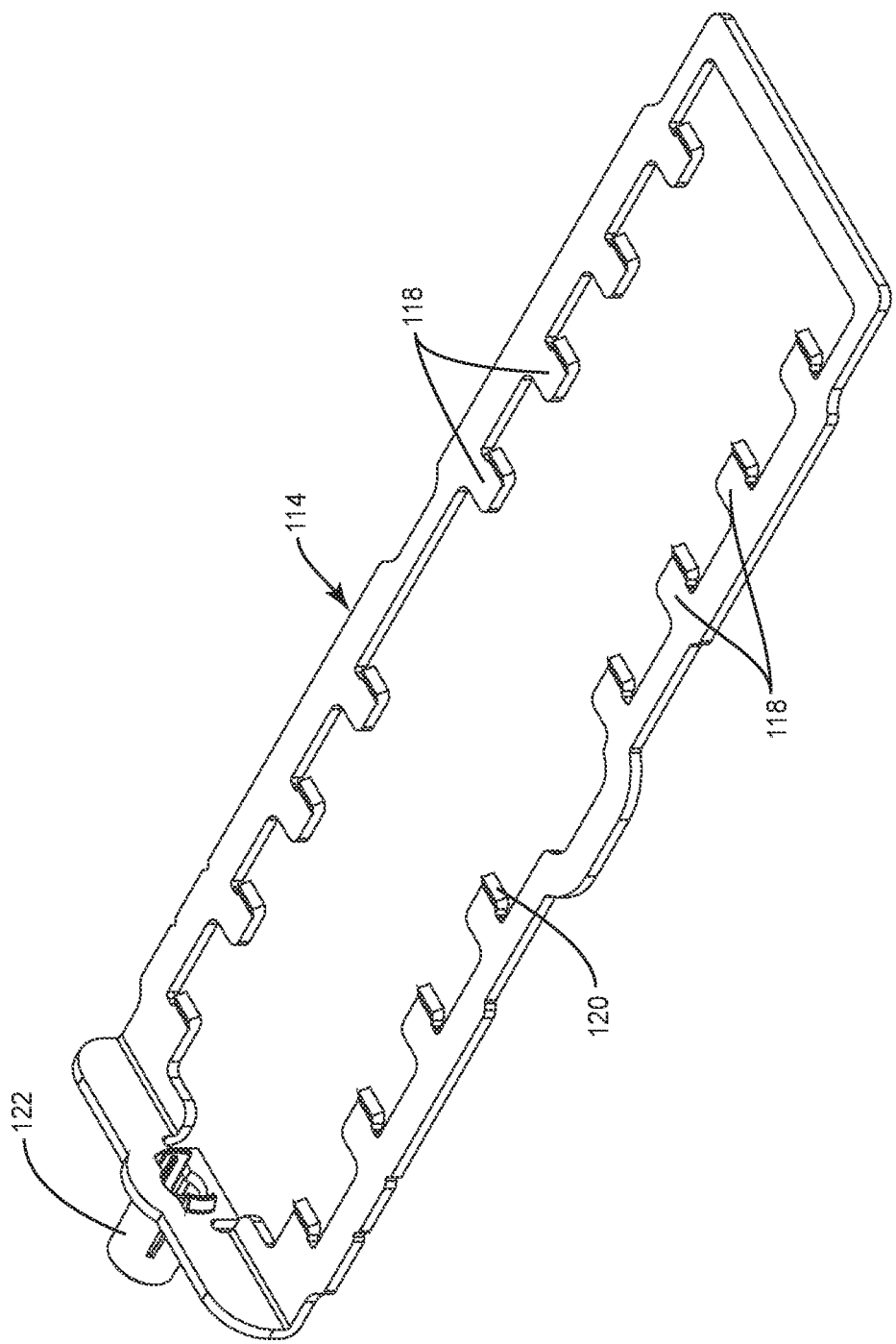
FIGS. 33-38 are views of locking components for securing the modular power components of FIGS. 24-30 within the example power system of FIGS. 1-9.
Figure 34:
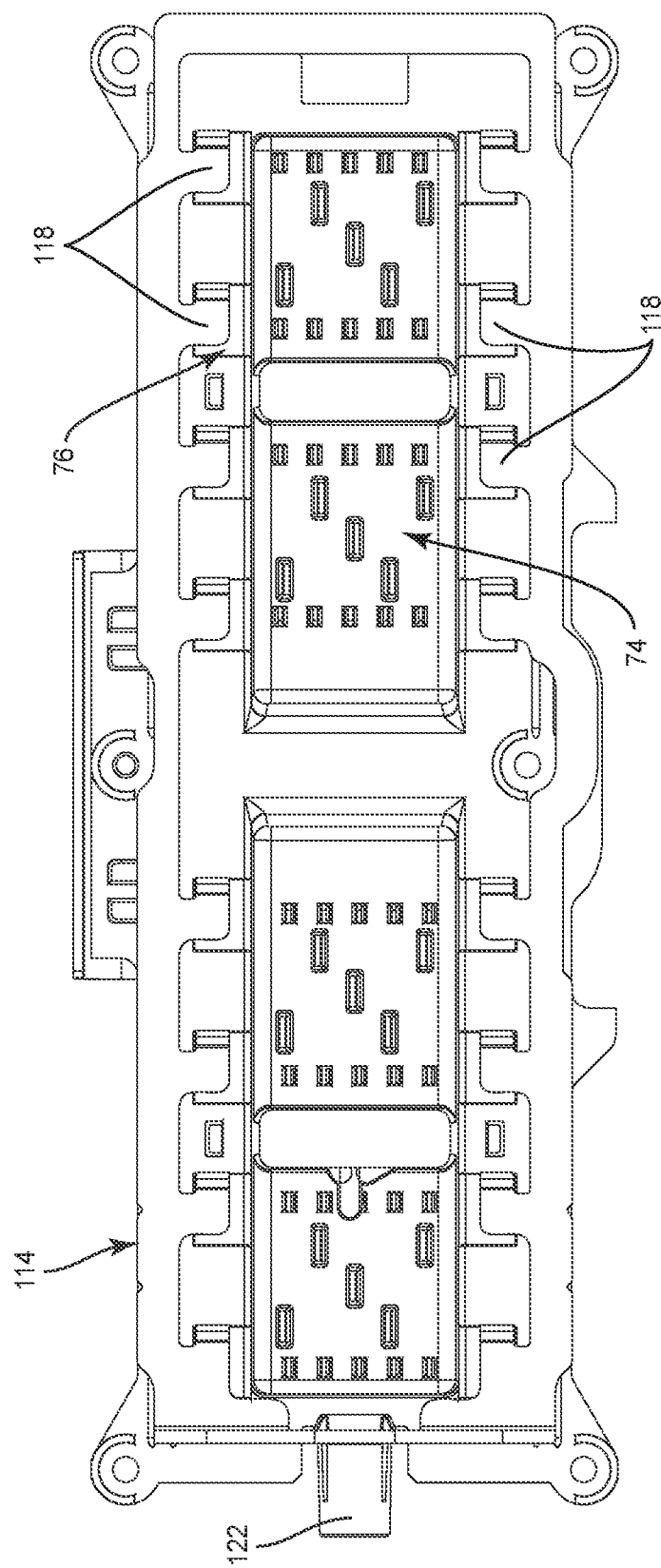
Figure 35:
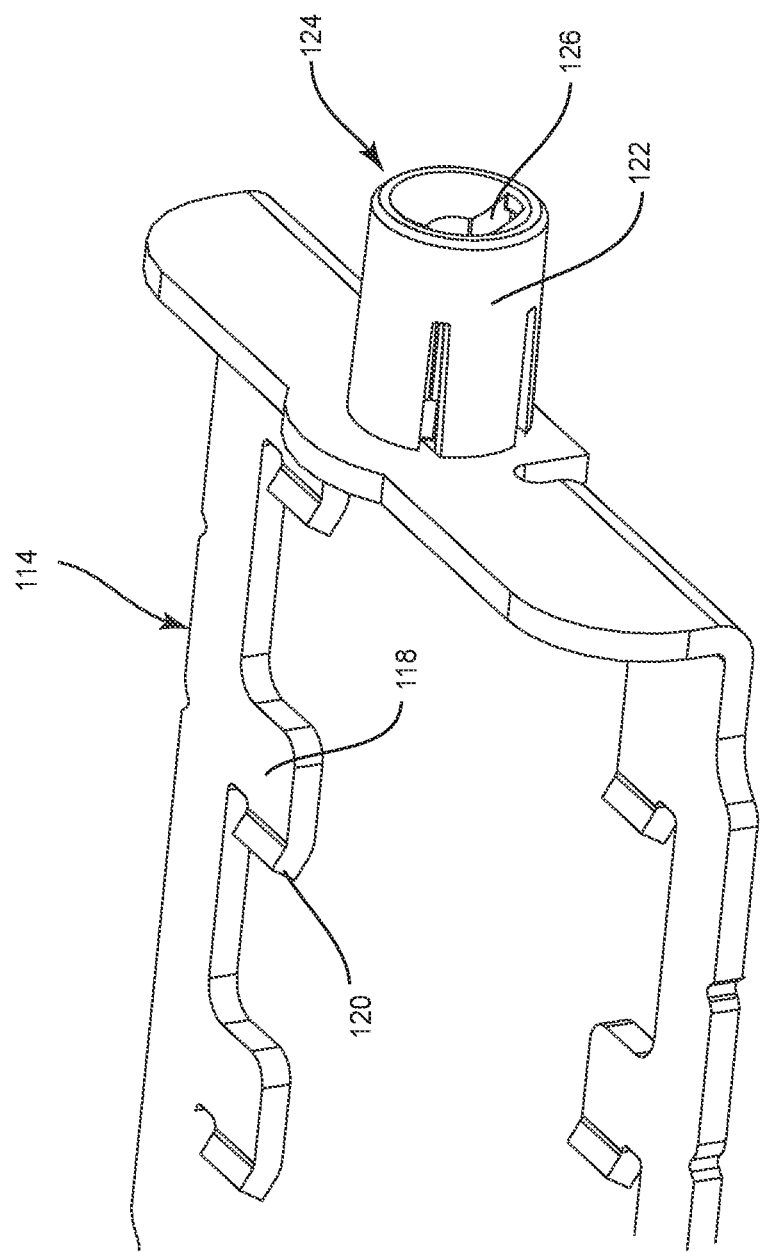
Figure 36:
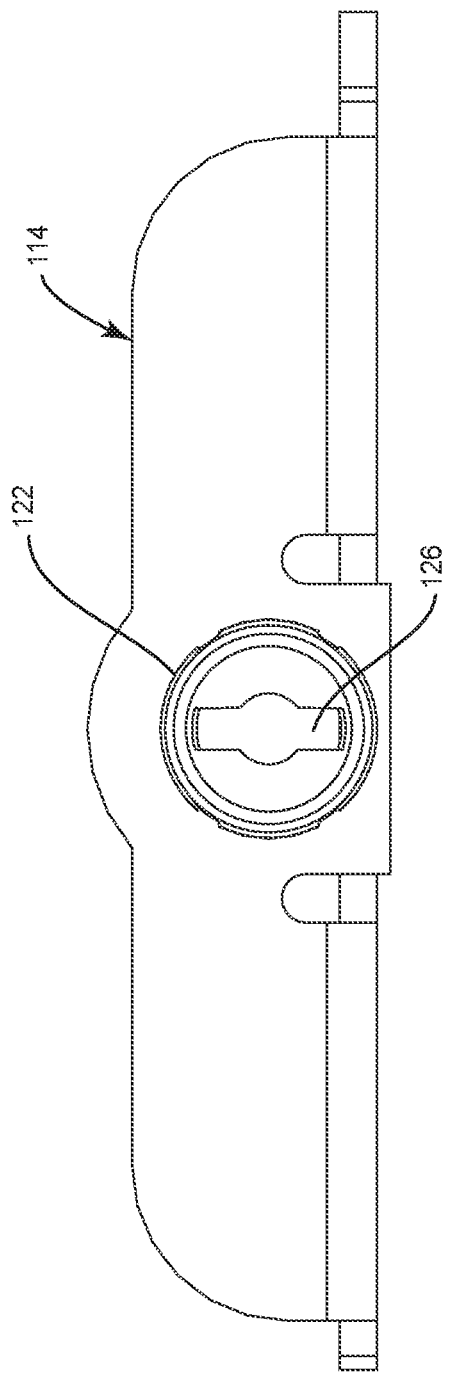

An example wirefree charging system 112 implemented as part of the power system is shown in FIG. 32. Wirefree power charging includes contact based charging systems, in which power is provided by a pad of exposed contacts, or via inductive charging in which wireless power is radiated via a resonant coil. Wirefree power charging may also be implemented via a system designed to provide capacitive charging.

In one embodiment, the wire free charging system 112 is formed to have contact strips as shown and as described in one or more of U.S. Pat. Nos. 7,932,638, 7,982,436, 7,986, 059, and/or U.S. Pat. No. 8,081,408, the content of each of which is hereby incorporated by reference. Specifically, in this implementation, the wirefree charging system is formed to have a first plurality of contact strips and a second plurality of contact strips which alternate in sequence. Different electrical potential is applied to the sets of contact strips. For example, charging potential of 5 volts may be applied to a first set of contact strips and ground potential may be applied to the second set of contact strips. The electrical contact strips alternate to form an electrically conductive pad having multiple electrical contact points.

To obtain wirefree charging power from the sets of contact strips, a handheld electronic device has a plurality of contacts on an exterior surface. The contacts engage the contact strips to receive electric power which is conveyed from the contacts to the charging system of the handheld electronic device.

Modular Power Component Locking System

FIGS. 33-38 show a mechanism for securing the modular power components 18 in the power system. Although the modular power components might be secured within the power system using many different securing mechanisms, in one implementation a slide 114 is used to selectively engage the feet 78 of the modular power components 18. In this implementation, the power system has two states—a locked state and an unlocked state. In the locked state, when the slide engages the feet 78 of the modular power components, the modular power components are fixed within the body 16. This is the normal state when the power system is being used. In the unlocked state, when the slide does not engage the feet 78 of the modular power components, the modular power components are not fixed within the body and may be removed to be replaced, repositioned by being rotated 180 degrees, and reinserted into the power system.

In one implementation, an aperture is formed in the body of the power system to enable the position of the slide 114 to be manipulated from outside the body. By accessing the slide 114, a person can move the slide from the locked position to the unlocked position, or from the unlocked position to the locked position, to enable the modular power components to be selectively locked within the power system or to be removable from the power system. Optionally a key 116 may be used to engage the slide and control movement of the slide 114.

Figure 37:
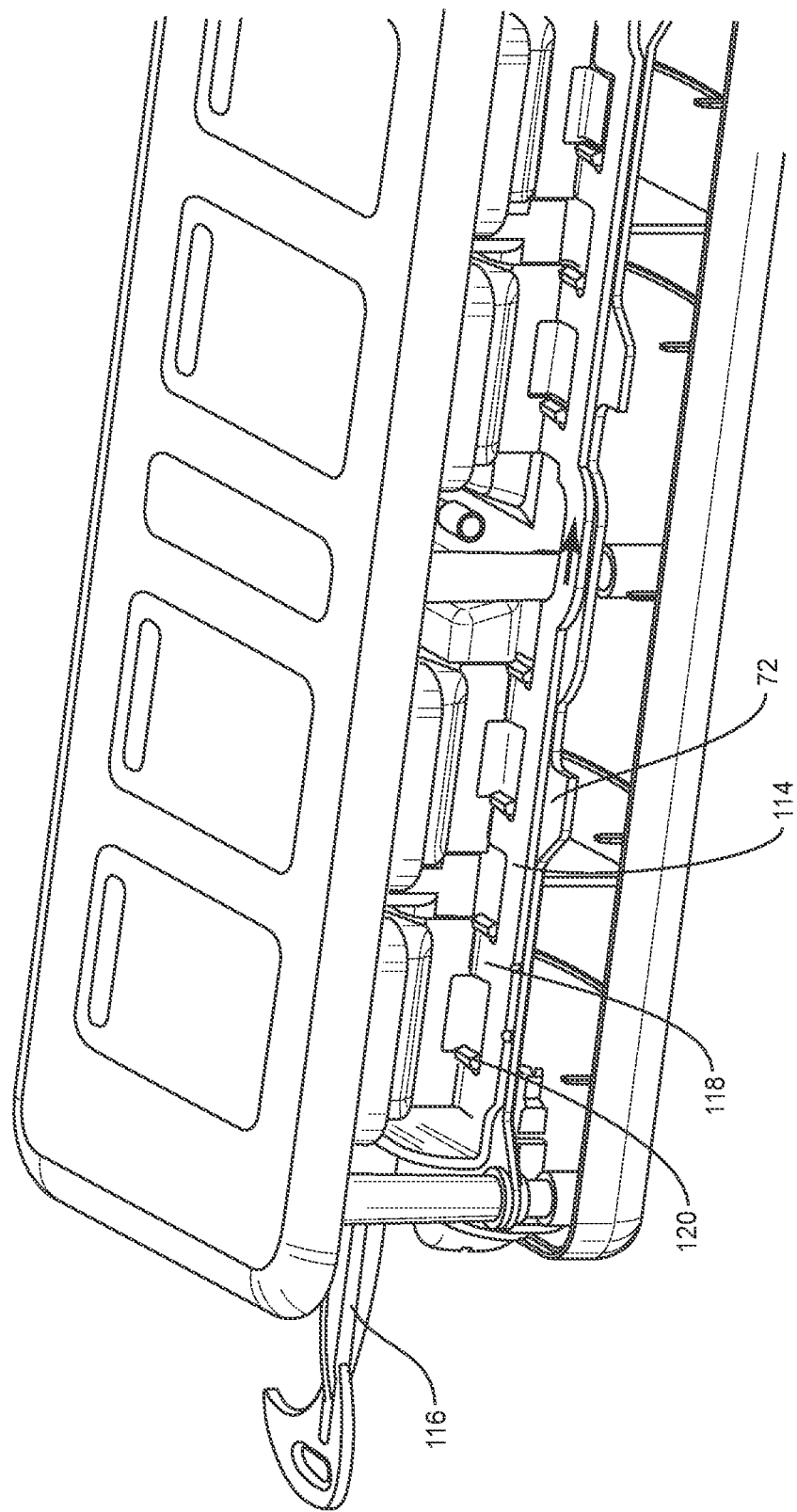
Figure 38:
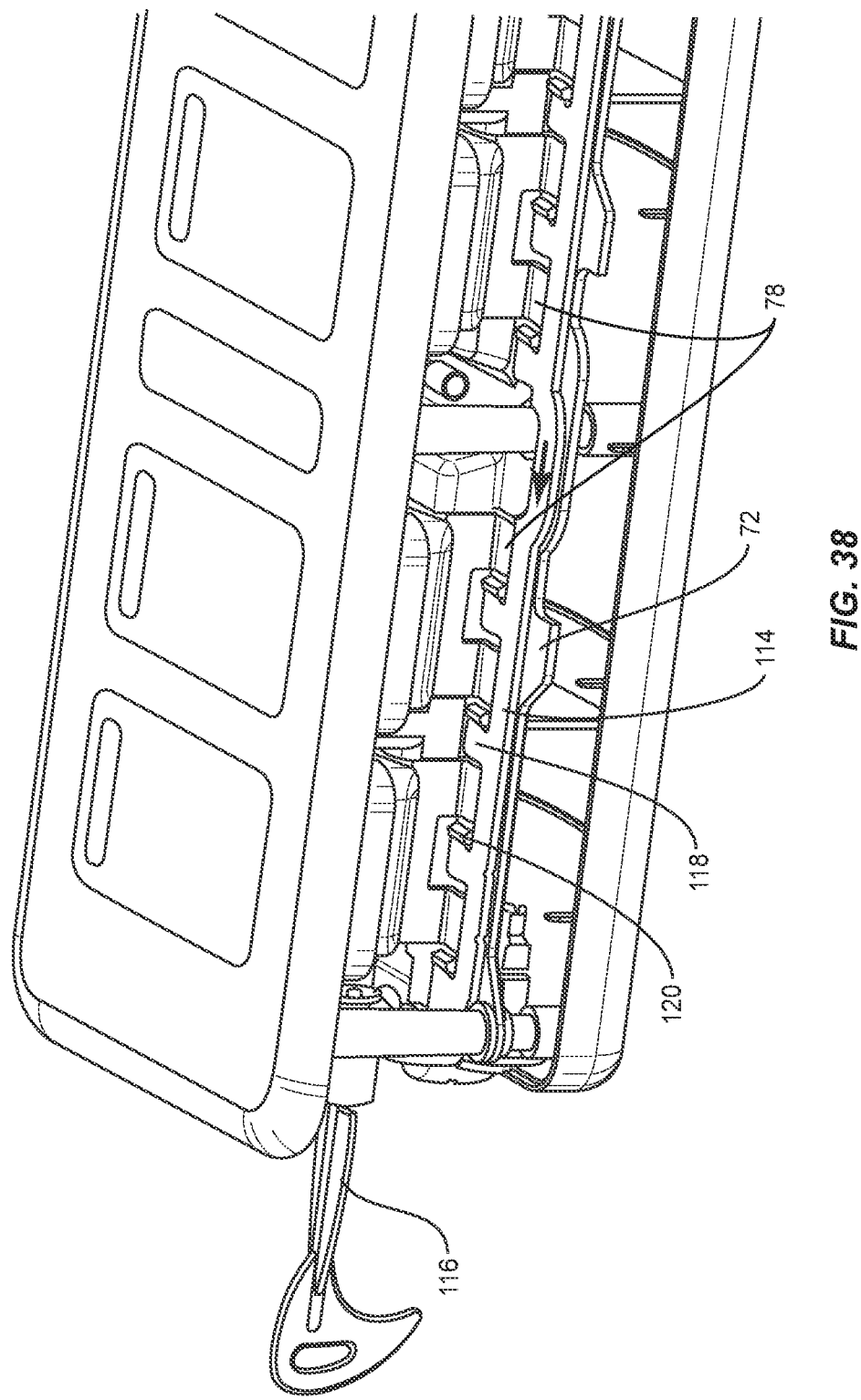

FIGS. 33-38 show an example locking mechanism in the form of a slide 114 according to an implementation. In this implementation, the slide 114 is designed to selectively hold the feet 78 of the modular power components 18 in the support areas 76 of the chassis 72 to allow the modular power components to be secured within the power system or removed from the power system. FIG. 37 shows the slide 114 in the locked position, and FIG. 38 shows the slide 114 in the unlocked position. In the locked position shown in FIG. 37, extensions 118 of slide 114 are disposed above the feet 78 of the modular power components 18 to prevent the modular power components from being removed from the power system. In the unlocked position shown in FIG. 38, extensions 118 of slide 114 are moved to be adjacent the feet 78 of the modular power components 18 so that the modular power components are able to be removed from the power system. Ramps 120 at the front edge of the extensions 118 help the extensions ride up over the feet to reduce binding between the slide and the modular power components when moving from the unlocked to the locked positions.

In one implementation, a cylinder 122 is connected to or forms a part of slide 114 (see FIG. 35) and is configured to extend into and move within the aperture formed in body 16. In the locked position shown in FIG. 37, a front face 124 of cylinder 122 is flush with the surface of body 16 as shown in FIG. 1. In the unlocked position, shown in FIG. 38, the cylinder 122 extends through the aperture in the body to protrude from body 16.

Face 124 of cylinder 122, in an implementation, has an aperture extending there-through to receive a key 116. Key 116 may be inserted into the aperture in cylinder 122 to enable the key to engage the slide 114 to pull the slide from the locked to the unlocked position. In one implementation the aperture 126 in cylinder 122 is slot-shaped and the key has a T-shaped end. The elongated portions of the T-shaped end pass through the slot shaped aperture 126 in cylinder 122. Once the T-shaped end has passed through cylinder 122, the key may be turned to cause the T-shaped end to engage a rear surface of the cylinder. When the key 116 is pulled, force will be exerted on the slide 114 to cause the slide 114 to be moved from the locked position shown in FIG. 37 to the unlocked position shown in FIG. 38 to cause the feet of the modular power components to be released. To remove the modular power components the modular power components are rotated up into the position shown in FIG. 3. A user can then grasp the modular power component and pull the modular power component away from body 16 to cause the prongs 94 to disengage from the connector slots 88 so that the modular power component can be removed from the power system.

To transition from the unlocked position to the locked position, the key 116 is removed from the aperture 126 and the protruding cylinder 122 is pushed back into the body 16 so that the front face 124 is once again approximately flush with the surface of the body.

In another implementation, the aperture in the cylinder is implemented as a key lock and, rather than extending through, the key 116 is inserted into the lock and turned to unlock the lock. In this implementation the cylinder may then pulled out to cause the slide to move within the body. Although several specific implementations have been described, other implementations may use other methods of causing a locking mechanism such as the slide to be moved within the body to selectively engage/disengage the modular power components.

A number of implementations have been described. Nevertheless, it will be understood that additional modifications may be made without departing from the scope of the inventive concepts described herein, and, accordingly, other implementations are within the scope of the following claims.

What is claimed is:

1. A connector for a power system, comprising:
   a first connector body having a first surface, a first portion of the first surface defining a concave area and a second portion of the first surface defining a convex area, the convex area and concave area being mirror images of each other, the first surface being configured to mate with a similarly configured second surface of a matching second connector body;
   a plurality of magnets disposed about the first surface of the first connector body;
   a first male electrical connector prong extending from the first surface of the first connector body; and
   a first female electrical connector slot defined in the first surface of the first connector body.

2. The connector of claim 1, wherein the first female electrical connector slot is configured to receive a second male electrical connector prong extending from the second surface of the matching second connector body.

3. The connector of claim 1, wherein the first male electrical connector prong extends outward from the first connector body from the concave area of the first portion of the first surface and the first female electrical connector slot is defined within the first connector body in the convex area of the second portion of the first surface.

4. The connector of claim 1, wherein the connector includes three male electrical connectors extending from the first surface of the first connector body and three female electrical connector slots defined within the first connector body and accessed through slots defined in the first surface.

5. The connector of claim 4, wherein the three male connectors extend from the concave area of the first portion of the first surface and the three female electrical connector slots are defined in the convex area of the second portion of the first surface.

6. The connector of claim 1, further comprising at least one asymmetric feature of the first surface defining the connector as either a male connector or a female connector.

7. The connector of claim 6, wherein the at least one asymmetric feature is a tab extending beyond the first surface on a first location of the first surface and an indentation extending into the first surface at a second location of the first surface.

8. The connector of claim 7, wherein the first location and the second location are symmetrically located about a center line of the first surface.

9. The connector of claim 6, wherein the first location and second location are reversed in a male version of the connector when compared to a female version of the connector.

10. A power system, comprising:
at least one modular power component having a first female receptacle formed thereon for receiving a male plug;
a body configured to receive the at least one modular power component;
a locking slide disposed within the body and movable relative to the body, the locking slide having a plurality of extensions to selectively engage feet of the modular power component within the body in a first position relative to the body and a corresponding plurality of openings to selectively not engage the feet of the modular power component within the body in a second position relative to the body, wherein the locking slide is movable between the first position and the second position to selectively enable the modular power component to be secured within the body when the locking slide is in the first position and to selectively enable the modular power component to be separated from the body when the locking slide is in the second position;
a chassis disposed within the body, the chassis having a plurality of slots in each of a plurality of modular power component receiving areas;
at least a second modular power component having a second female receptacle formed thereon;
the plurality of modular power components being supported by the chassis in the modular power component receiving areas, the modular power components having power connectors extending through the slots; and
a power distribution system disposed below the chassis and in electrical communication with the power connectors of each of the plurality of modular power components;
wherein a first subset of the slots in a first of the receiving areas are arranged to correspond with the power connectors of a first of the modular power components when the first of the modular power components is oriented in a first direction, and wherein a second subset of the slots in the first of the receiving areas are arranged to correspond with the power connectors of the first of the modular power components when the first of the modular power components is oriented in a second direction.

11. The power system of claim 10, wherein the locking slide is movable from the first position to the second position from outside the body via an aperture in the body.

12. The power system of claim 10, wherein the first direction is 180 degrees rotated from the second direction.

13. The power system of claim 10, wherein at least one slot of the first subset of slots is also included in the second subset of slots.

14. The power system of claim 13, wherein at least two slots of the first subset of slots are not included in the second subset of slots.

15. The power system of claim 10, wherein the power distribution system includes a plurality of conductors disposed below the slots.

16. The power system of claim 15, wherein the plurality of conductors includes a first pair of hot conductors, a second pair of neutral conductors, and at least one ground conductor.

17. The power system of claim 16, wherein the plurality of conductors are formed as bus bars, wherein the ground conductor is a middle bus bar and the first and second pair of hot and neutral conductors being arranged symmetrically relative to the middle bus bar.

18. The power system of claim 17, wherein the chassis is configured to shed water away from the plurality of conductors.

19. The power system of claim 17, wherein the chassis is configured to prevent a person from touching the conductors when the modular power component is removed from the power system.

20. A power system, comprising:
a body configured to house one or more modular power components, the body having a top surface with a circumferential lip extending beyond a peripheral edge of the body to support the body within an aperture in a worksurface of a piece of furniture when the body is inserted into the aperture in the worksurface of the piece of furniture;
a retaining bracket configured to extend beyond the peripheral edge of the body and below a lower surface of the worksurface of the piece of furniture;
a plurality of first friction elements on the retaining bracket, the plurality of first friction elements being configured to engage a corresponding plurality of second friction elements on the body to hold the retaining bracket relative to the body; and
spring tabs formed on an upper surface of the retaining bracket to engage the lower surface of the worksurface of the piece of furniture to pull a lower surface of the circumferential lip into snug engagement with a top surface of the worksurface of the piece of furniture.

21. The power system of claim 20, wherein the retaining bracket is configured to encircle the body, wherein first friction elements on the retaining bracket are formed in four locations about an interior surface of the bracket, and wherein the second friction elements on the body are formed in four corresponding locations on an exterior surface of body.

22. The power system of claim 20, wherein the body has a plurality of tabs, and wherein the second friction elements on the body are formed on the tabs.

23. The power system of claim 20, wherein the first and second friction elements are serrated teeth.

24. The power system of claim 20, wherein the first and second friction elements are bumps and detents.

* * * * *